United States Patent
Salessi

(10) Patent No.: US 8,230,690 B1
(45) Date of Patent: Jul. 31, 2012

(54) MODULAR LED LAMP

(76) Inventor: Nader Salessi, Laguna Niguel, CA (US)

( * ) Notice: Subject to any disclaimer, the term of this patent is extended or adjusted under 35 U.S.C. 154(b) by 342 days.

(21) Appl. No.: 12/592,563

(22) Filed: Nov. 27, 2009

Related U.S. Application Data

(63) Continuation-in-part of application No. 12/454,532, filed on May 19, 2009, now Pat. No. 8,159,152.

(60) Provisional application No. 61/273,495, filed on Aug. 5, 2009, provisional application No. 61/273,885, filed on Aug. 10, 2009, provisional application No. 61/128,272, filed on May 20, 2008.

(51) Int. Cl.
*F25B 21/02* (2006.01)

(52) U.S. Cl. ........... 62/3.7; 62/3.2; 165/80.2; 165/80.3; 165/80.4; 165/185; 362/294; 362/373; 315/112; 315/113; 315/309

(58) Field of Classification Search ............ 315/32, 315/113, 169.1, 291, 309, 112; 362/327, 362/362, 373, 547, 294; 257/E33.059, E25.02, 257/E23.082, 290; 165/80.2, 80.3, 80.4, 165/185; 62/3.2, 3.7

See application file for complete search history.

(56) References Cited

U.S. PATENT DOCUMENTS

| | | | | |
|---|---|---|---|---|
| 3,173,610 A | * | 3/1965 | Feibush et al. | 236/44 R |
| 4,463,214 A | * | 7/1984 | Lowther | 136/208 |
| 4,765,139 A | * | 8/1988 | Wood | 60/527 |
| 5,958,100 A | * | 9/1999 | Farnworth et al. | 65/47 |
| 6,034,318 A | * | 3/2000 | Lycke et al. | 136/205 |
| 6,118,685 A | | 9/2000 | Takeuchi et al. | |
| 6,407,922 B1 | | 6/2002 | Eckblad et al. | |
| 6,482,520 B1 | | 11/2002 | Tzeng | |
| 6,503,626 B1 | | 1/2003 | Norley et al. | |
| 6,517,218 B2 | * | 2/2003 | Hochstein | 362/294 |
| 6,686,532 B1 | * | 2/2004 | Macris | 136/204 |
| 6,708,501 B1 | * | 3/2004 | Ghoshal et al. | 62/3.7 |
| 6,771,502 B2 | | 8/2004 | Getz, Jr. et al. | |
| 6,841,250 B2 | | 1/2005 | Tzeng | |
| 6,976,769 B2 | | 12/2005 | McCullough et al. | |
| 7,150,914 B2 | | 12/2006 | Clovesko et al. | |
| 7,160,619 B2 | | 1/2007 | Clovesko et al. | |
| 7,276,273 B2 | | 10/2007 | Clovesko et al. | |
| 7,280,359 B2 | | 10/2007 | Fujiwara | |
| 7,303,820 B2 | | 12/2007 | Capp et al. | |
| 7,306,847 B2 | | 12/2007 | Capp et al. | |

(Continued)

FOREIGN PATENT DOCUMENTS

WO  WO 2006056066  6/2006

*Primary Examiner* — Douglas W Owens
*Assistant Examiner* — Thai Pham
(74) *Attorney, Agent, or Firm* — Kuta IP Law LLC; Christine M. Kuta

(57) ABSTRACT

A modular solid-state lamp has a plurality of replaceable and rearrangeable modules. The modular lamp uses active cooling and passive cooling for thermal management. One cooling system for the modular lamp includes at least one active cooling device and a graphite heat sink in thermal contact with the at least one active cooling device to further enhance the efficiency of the cooling system. The modular solid-state lamp includes at least two modules, a power supply module and a light source module. The power supply module includes a power supply and LED driver that are able to power one or more light source modules. The power supply module further includes sensors that further improve the energy-efficiency of the lamp.

6 Claims, 25 Drawing Sheets

U.S. PATENT DOCUMENTS

| | | |
|---|---|---|
| 7,344,279 B2 | 3/2008 | Mueller et al. |
| 7,365,988 B2 | 4/2008 | Reis et al. |
| 7,825,324 B2 * | 11/2010 | Hodes et al. ............ 136/208 |
| 2005/0276053 A1 | 12/2005 | Nortrup et al. |
| 2005/0279949 A1 | 12/2005 | Oldham et al. |
| 2006/0151801 A1 | 7/2006 | Doan et al. |
| 2006/0260793 A1 * | 11/2006 | Yang et al. ............... 165/185 |
| 2007/0013057 A1 | 1/2007 | Mazzochette |
| 2007/0042188 A1 | 2/2007 | Clovesko et al. |
| 2007/0053168 A1 | 3/2007 | Sayir et al. |
| 2007/0077434 A1 | 4/2007 | Clovesko et al. |
| 2007/0158050 A1 | 7/2007 | Norley et al. |
| 2007/0189011 A1 | 8/2007 | Song et al. |
| 2007/0278212 A1 | 12/2007 | Okimura |
| 2008/0083446 A1 * | 4/2008 | Chakraborty et al. ...... 136/205 |
| 2008/0158876 A1 | 7/2008 | Thrailkill |
| 2008/0218977 A1 | 9/2008 | Reis et al. |
| 2009/0040719 A1 | 2/2009 | Horng |
| 2009/0095461 A1 | 4/2009 | Lemak et al. |
| 2010/0236595 A1 * | 9/2010 | Bell et al. .................. 136/205 |

* cited by examiner

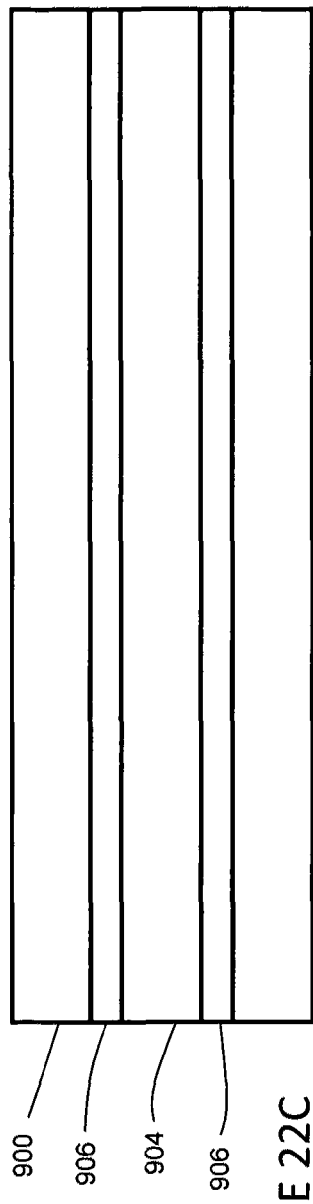
FIGURE 22C
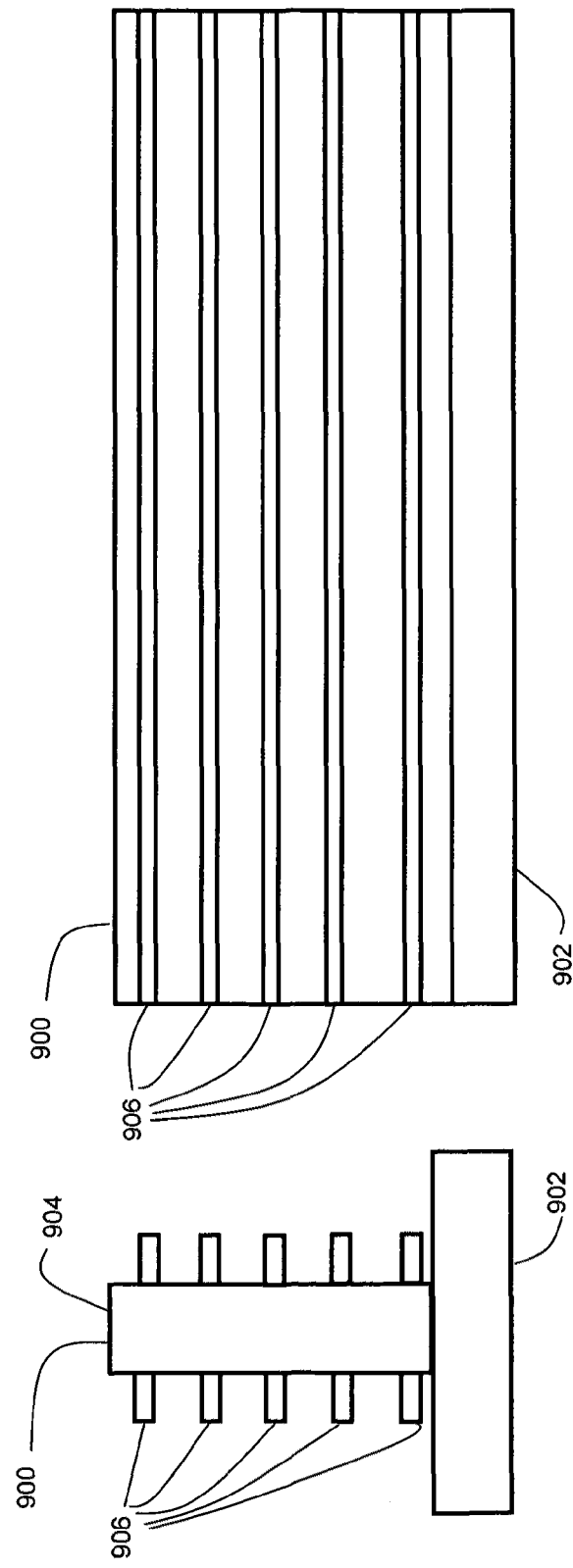
FIGURE 22B
FIGURE 22A

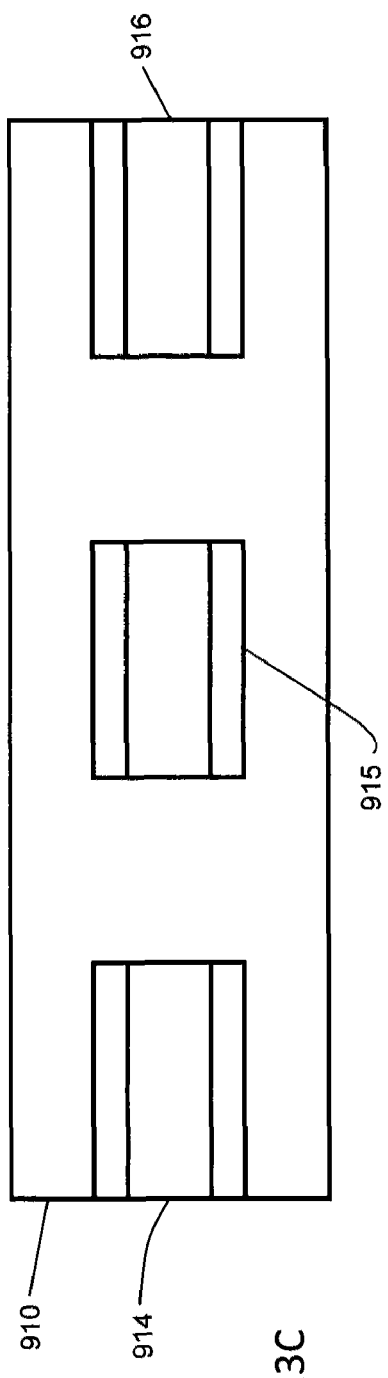
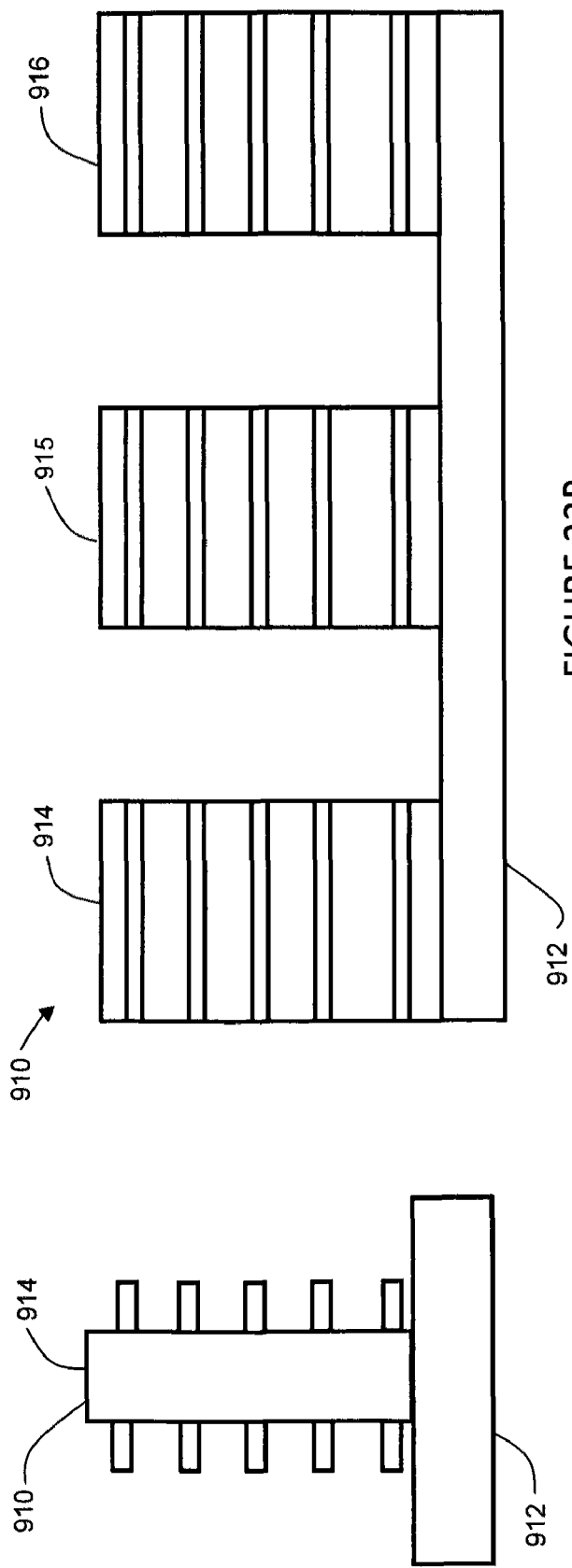
FIGURE 23C
FIGURE 23B
FIGURE 23A

MODULAR LED LAMP

CROSS-REFERENCES

This application claims priority of U.S. provisional application Ser. No. 61/273,495, filed Aug. 5, 2009 and titled, "Active Cooling System for a Lamp" by the present inventor the contents of which are hereby incorporated by reference in their entirety. This application claims priority of U.S. provisional application Ser. No. 61/273,885, filed Aug. 10, 2009 and titled, "Modular Solid-State Lamp" by the present inventor, the contents of which are hereby incorporated by reference in their entirety. This application is a continuation-in-part of U.S. patent application Ser. No. 12/454,532 filed May 19, 2009 now U.S. Pat. No. 8,159,152 and titled, "High-Power LED Lamp," by the present inventor which claims priority of U.S. provisional application Ser. No. 61/128,272 filed May 20, 2008 and titled, "High-Power LED Lamp" by the present inventor the contents of which are hereby incorporated by reference in their entirety.

BACKGROUND

Gas discharge lamps and incandescent lamps are well known in the art. Gas sources and incandescent lamps have relatively high energy consumption. Further, gas sources and incandescent lamps have relatively short lifetimes and are susceptible to breakage, typically leading to high maintenance costs. Further, the light intensity of gas discharge lamps tends to decrease over time with use. Additionally, gas discharge lamps produce ozone due the hazardous material/gas they require for excitation of electrons. After a gas discharge lamp's useful life, hazardous material and poisonous gases used in the lamp are released to environment affecting, among other things, the ozone layer. Additionally, gas discharge lamps produce ultra violet light that tends to cause deterioration of many materials, damage to some living organisms, and to some elements of the environment.

Solid state lighting, such as light emitting diode (LED) lighting has been developed to overcome some of the problems of gas discharge lamps and incandescent lamps. Many conventional LED devices, however, are limited by thermal energy-management issues.

It is known that LEDs exhibit negative temperature coefficient aspects, i.e. at fixed power input, as the device's operating heat rises, the device's light output decreases and it shortens the life of LED. It is, however, desirable to run LEDs using high current, because the higher the current, the higher the brightness of the emitted light. Further, high heat during use can shorten the useful life of an LED. Accordingly, there is motivation to remove heat as much as possible in order to operate an LED optimally with regard to power input and light output and LED life.

In addition, where a plurality of LED's are required for higher brightness, there are limits in conventional lamp technology to the number of LEDs within a defined space due to the problem of heat dissipation. Accordingly, it is desirable to cool an LED device in order to maximize energy efficiency and lifespan as well as to broaden design options.

Conventional solutions to undesirable thermal buildup include fans, cooling fins, spacing assemblies, etc. to reduce lamp housing temperature. Another conventional solution involves mounting LED modules on large conductive heat sinks. A light emitting diode (LED) must be mounted on a relatively large metal heat sink to dissipate the heat when the diode is run using high current. In high use and in demanding situations, the thermal transfer from the LEDs through a thermally connected conventional heat spreading plate to the housing is insufficient to maintain a desirable LED temperature. Unfortunately, thermal back-flow may occur as a lamp housing is heated by the ambient atmosphere beyond an optimal point which allows thermal conduction back to the heat spreading plate. In such situations, rapid LED degradation often occurs and unit efficiency drops.

Solid state thermoelectric modules (TEM), also referred to as thermoelectric coolers (TEC), or heat pumps, have been used in various applications. A TEM, in a thermocooling application, converts electrical energy into a temperature gradient, known as the "Peltier" effect. By applying a current through a TEM, a temperature gradient is created and heat is transferred from one side, the "cold" side of the TEM to the other side, the "hot" side.

The Peltier effect is well known by those skilled in the related arts and provides an active solid-state thermoelectric cooling function from a cool side to a hot side. The cool side is commonly placed against a surface or substrate which requires cooling. For example, the back surface of an LED assembly. The hot side is commonly placed against a surface or substrate which absorbs the transferred thermal energy and transfers it through conduction to a heat spreading plate. Through the utilization of these thermo-electric effects, thermal transfer from a cool side to a hot side can be controlled by controlling a current supplied to the thermo-electric effect.

Many conventional solid-state lamps are expensive to manufacture, and, due to the nature of the failures in a solid-state lamp, difficult and expensive to repair. Nevertheless, the energy-efficiency characteristics of solid-state lamps make them an attractive alternative to incandescent and fluorescent lighting.

For the foregoing reasons, there is a need for a solid-state lamp having effective thermal management with improved maintenance qualities.

SUMMARY

The present invention is directed to an apparatus to provide solid-state illumination efficiently, reliably and with flexible design. In order to maintain efficient light output from a lamp including LEDs, especially a lamp including high brightness LED arrays, it is beneficial for the lamp to be provided with an effective heat removal system. An effective heat removal system also typically increases the lamp's lifetime under operating conditions. Accordingly, embodiments of the present invention include an improved light emitting apparatus having a highly efficient cooling system.

Embodiments of the present invention include a solid-state high-powered lighting assembly using a solid-state thermoelectric cooling system. A high-power LED lamp is constructed using a plurality of replaceable modules. Each module includes a plurality of light engine units. In a first embodiment, each light engine unit has an LED die coupled to thermoelectric cooling device. The thermoelectric cooling device is supplied with a predetermined constant current. The predetermined constant current is based on measured cooling needs of the LED die and determined to substantially maximize energy efficiency and substantially maximize LED life. The modules are configured to operate in an array of such modules. In one embodiment of the invention, the array is configured to provide illumination for a specific application such as a street lamp, parking lot illumination, parking structure illumination and area lighting In one embodiment, a unit for a high-power LED lamp includes an LED die and a thermo-electric cooling device coupled to the LED die. A power source supplies a fixed current to the thermo-electric cooling device wherein the fixed current is based on heat generated by the LED die in normal operation. Accordingly, the unit operates without a controller. The thermo-electric cooling device supplies cooling to the location where heat is generated and without a controller thereby minimizing space. Further, power usage is also minimized. This embodiment further realizes a savings of the cost of a controller.

In an alternative arrangement, the thermo-electric cooling device is positioned at a hot-spot of the LED die thereby supplying heat transfer to the location where it is needed minimizing waste.

In another embodiment of the invention, a plurality of units is supported by a common substrate to form module for a high-power LED lamp. The module, in a first embodiment includes a conductive substrate. The conductive substrate supports a plurality of LED units mounted on the conductive substrate wherein each LED unit of the plurality includes an LED die and a thermo-electric cooling device thermally coupled to the LED die. The module further includes a means for supplying each thermo-electric cooling unit with a fixed current.

In another embodiment of the invention, a high power LED lamp includes a plurality of LED modules configured to operate together to provide light, each module configured to be removable and replaceable. Each module includes a conductive substrate and a plurality of LED units mounted on the conductive substrate wherein each LED unit of the plurality includes an LED die and a thermo-electric cooling device thermally coupled to the LED die. The module further includes a means for supplying each thermo-electric cooling unit with a fixed current.

A cooling system for a solid-state lamp includes at least one active cooling device and an efficient heat sink. In one embodiment, the active cooling system for a solid-state lamp includes a heat spreader such as a graphite heat sink and at least one thermal generator. The at least one thermal generator operates to further dissipate heat from light emitting diodes (LEDs) of the lamp. In some embodiments, a Peltier device located between the LEDs and the heat spreader provides additional cooling.

The present invention is directed to a modular solid-state lamp. Each lamp includes at least two modules, one module holding light sources such as LEDs and a cooling element and another module including a power supply, and sensors that further increase the energy efficiency of the lamp. The power supply module is able to power a plurality of light source modules.

Typically, an embodiment of the solid-state lamp includes at least three modules. Embodiments of the present invention include a power supply module that is configured such that lighting modules may be connected to the ends of the power supply module or to the sides of the power supply module.

The modular design of the lamp eases maintenance and tends to lower costs of maintenance as a failed light source module is easy to replace and is less expensive to replace than replacement of the entire lamp.

The present invention together with the above and other advantages may best be understood from the following detailed description of the embodiments of the invention illustrated in the drawings, wherein:

DRAWINGS

FIG. 22A is a front view of a heat sink according to one embodiment of the invention;

FIG. 22B is a right side view of the heat sink of FIG. 22A;

FIG. 22C is a top view of the heat sink of FIG. 22A;

FIG. 23A is a front view of an alternative embodiment of a heat sink;

FIG. 23B is a right side view of the heat sink of FIG. 23A;

FIG. 23C is a top view of the heat sink of FIG. 23A;

DESCRIPTION

A solid-state lamp is constructed using a plurality of replaceable and re-arrangeable modules. The replaceable modules typically include at least one light source module and a power supply module. The replaceability of the modules simplifies maintenance and repair of the lamp. The light source module includes solid-state light sources such as LEDs. The power supply module includes a power supply that is able to power one or more light source modules. The modular lamp uses both passive and active cooling in thermal management. An active cooling system in the lamp includes a heat spreader such as a heat sink and at least one thermal generator. The heat spreader, in some embodiments, is made of graphite and the at least one thermal generator operates to further dissipate heat from light emitting diodes (LEDs) of the lamp. In some embodiments, a Peltier device located between the LEDs and the heat spreader provides additional cooling. The power supply module further includes sensors that further improve the energy-efficiency of the lamp.

Figure 1:
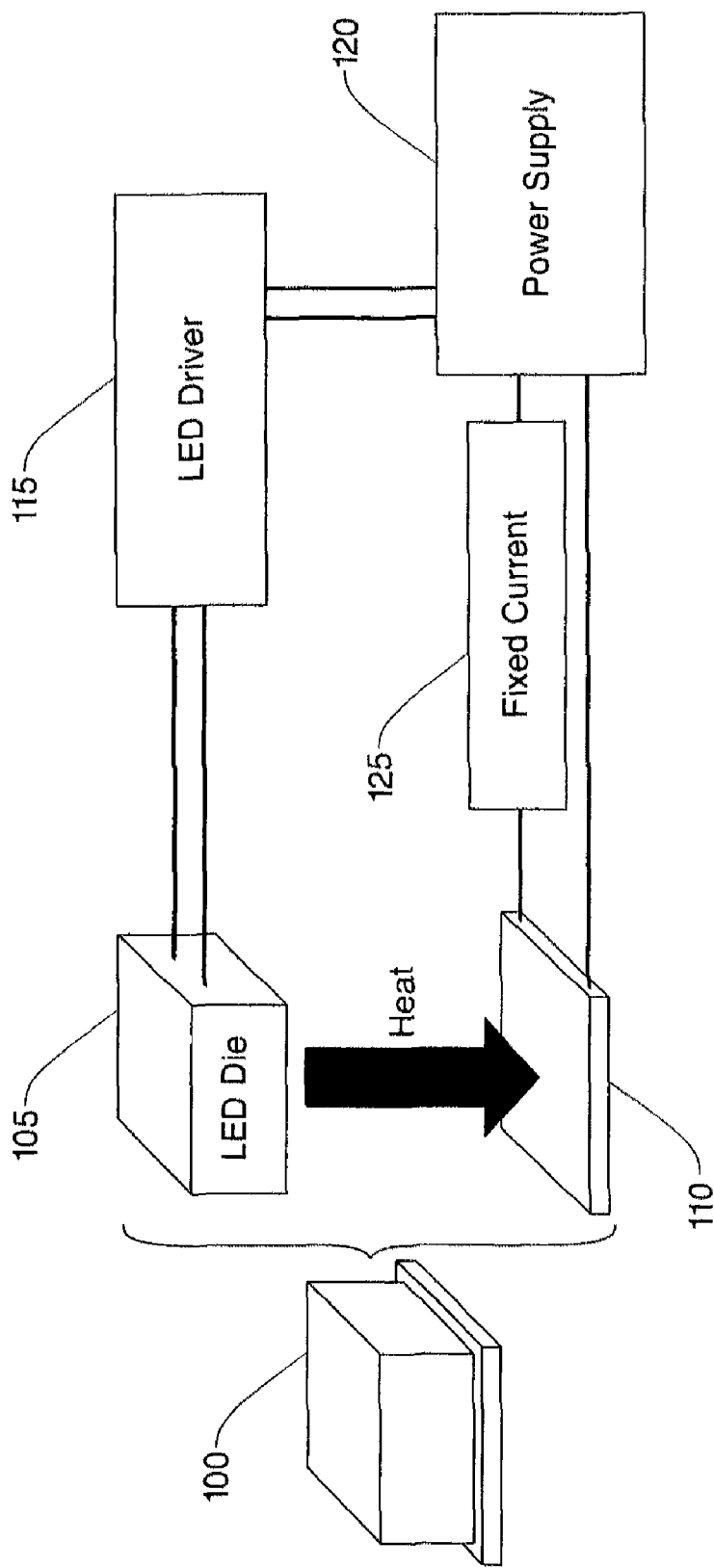
FIG. 1 is a diagram illustrating a unit of a high-power LED lamp according to principles of the invention.

FIG. 1 shows a light engine unit according to one embodiment of the invention. The light engine unit ("the unit") 100 includes an LED die 105 thermally engaged with a cooling device 110. The LED die 105 is electrically coupled to an LED driver 115. A power supply 120 powers the LED driver 115 and supplies a fixed current 125 to the cooling device 110.

The LED die 105 is, for example, a chip of semiconducting material impregnated with impurities to create the p-n junction and configured to emit light when electrically biased. The LED die 105 has a thickness, for example, of 100-150 micrometers. The cooling device 110 is, for example, a thermo-electric device and is thermally engaged with the LED die such that heat is directed away from the LED die. An example thermo-electric device has a thickness of 10 micrometers. The thermo-electric device, also referred to as Peltier device, removes heat from the LED die through the Peltier effect. The thermo-electric device creates a temperature difference in response to an applied voltage. In one embodiment, the thermo-electric device is a thin film micro cooling device. In another embodiment, the thermo-electric device is a nanotechnology device. The cooling device is for example a nanocooler available from nanoCoolers of Austin, Tex. Alternatively, the cooling device is a thin film thermo-electric device available from Micropelt GmbH of Freiburg, Germany. In one embodiment, the cooling device is coupled to the LED die using conventional semiconductor attachment method such as soldering. In an alternative embodiment, the LED and the cooling device are manufactured together using micro processes or further alternatively using nanotechnology processes. In a preferred embodiment, the micro or nano manufacturing produces a layered LED/cooling device structure. The present invention, however, is not limited by the method of thermally coupling the LED die 105 to the cooling device 110.

The LED driver 115 is a typical LED driver. The power supply 120 is configured to supply a predetermined fixed current 125 to the cooling device 110. In a first embodiment of the invention, the fixed current 125 is based on typical junction temperature of the LED. In another embodiment, the fixed current 125 is based on typical usage and design of the lamp in which the LED unit 100 operates. Example applications of a lamp according to the present embodiment are a street lamp, parking lot lamp and a parking structure lamp. Accordingly, typical usage factors include weather factors and other environmental factors as well as lamp design. Another factor that may be used in determining the fixed current is average ambient temperature around the lamp in operation.

In operation, the LED die 105 emits light in response to the LED driver 115 which are both powered by the power supply 120. The cooling device 110 is supplied with a fixed current 125 by the power supply 120 and operates to cool the LED die 105. Operating the cooling device 110 at the fixed current 125 enables the unit 100 to operate without a controller thereby realizing both a cost savings and a form factor benefit in saving space that would be otherwise occupied by housing a controller.

Figure 2:
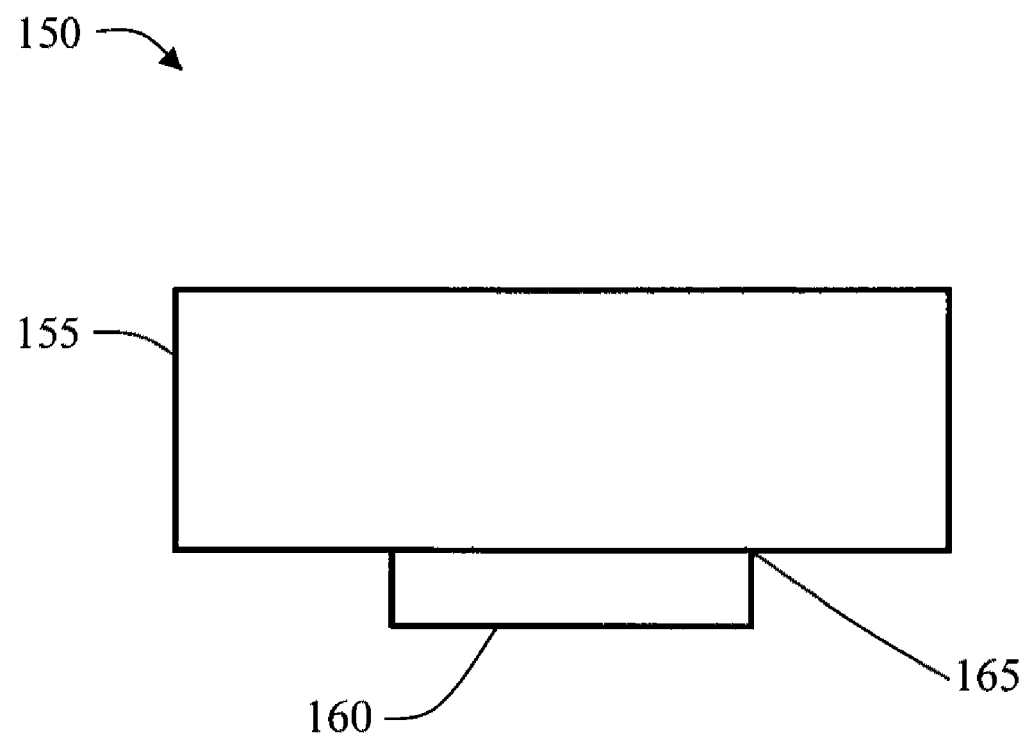
FIG. 2 is a side view of a unit of a high-power LED lamp showing advantageous positioning of a thermo electric cooling device according to principles of the invention.

FIG. 2 shows an alternative embodiment of a high-power LED unit wherein the thermo-electric device is advantageously positioned. The unit 150 includes an LED die 155 and a cooling device 160. The LED die 155 and cooling device 160 are thermally coupled together. An LED die in some configurations has a hot spot 165. In this embodiment, the cooling device 160 is positioned to provide cooling at the hot spot 165 of the LED die 155. This embodiment has the benefit that cooling is provided at the location where it is most needed. Positioning the cooling device directly against the LED die tends to maximize efficiency because the cooling is concentrated substantially on the LED die where thermal energy is generated and not on the surrounding elements.

Figure 3:
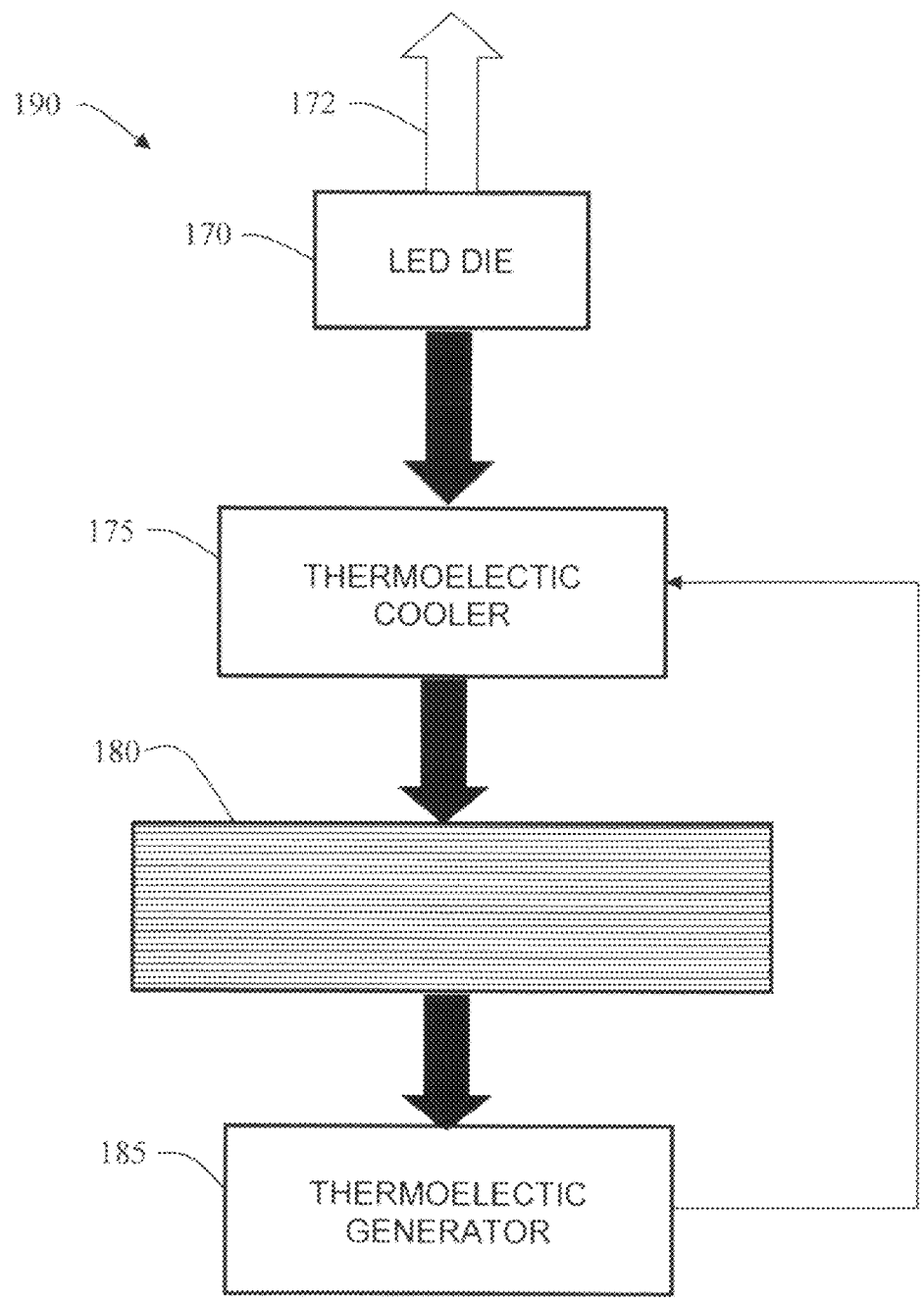
FIG. 3 illustrates an alternative embodiment of a unit of a high-power LED lamp according to principles of the invention.

FIG. 3 shows a further alternative embodiment of a high-power LED unit in diagram format. The LED unit 190 includes an LED die 170 emitting light 172, a thermoelectric cooler 175, a heat sink 180 and a thermoelectric generator 185. The thermoelectric generator 185 is for example the dTEG UPF40 Power Generator available from Nextreme Thermal Solutions, Inc. of Durham, N.C. In the LED unit 190, the LED die 170 is thermally coupled to the thermoelectric cooler 175. The thermoelectric cooler 175 is further thermally coupled to the heat sink 180. The heat sink 180 is further thermally coupled to the thermoelectric generator 185. The thermoelectric generator 185 is electrically coupled to the thermoelectric cooler 175.

In operation, the LED die 170 emits light and generates heat. The thermoelectric cooler 175 takes DC current as input and transfers heat from the LED die coupling to the heat sink coupling thereby removing heat from the LED die 170. The heat sink 180 dissipates heat passively. At least some of the heat from the heat sink 180 is transferred to the thermoelectric generator 185. The thermoelectric generator 185 generates a DC current. The DC current is received by the thermoelectric cooler 175 and is a portion of the energy needed for the operation of the thermoelectric cooler 175. The thermoelectric cooler 185 thus provides additional cooling that enables the heat sink 180 to be reduced in size over a heat sink needed in a configuration without the thermoelectric cooler 175.

Figure 4:
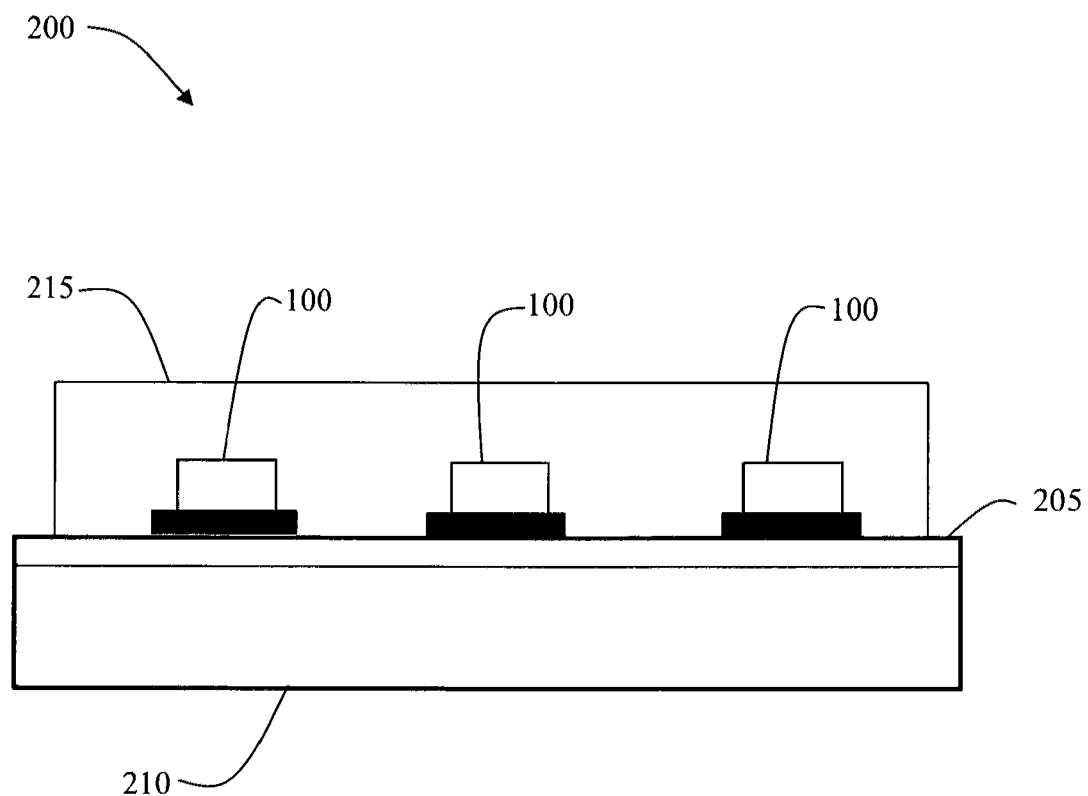
FIG. 4 is a side view of an LED module for a high-power LED lamp according to principles of the invention.

FIG. 4 is a side view of an LED module 200 for a high-power LED lamp according to one embodiment of the invention. The LED module 200, shown in side view, has a substrate 205 supporting a number of LED units 100. The substrate 205 provides electrical interconnection from the LED units 100 to the LED driver 115 (not shown) and power supply (not shown). In one embodiment, the LED module 200 is configured to fit into a support array of such modules to form a solid state lamp according to one embodiment of the invention. This will be described in further detail below. In another embodiment of the invention, the LED module 200 is configured to couple both physically and electrically with other additional modules to form a solid state lamp. A cover 215 encloses the LED units 100. In a first embodiment, the cover 215 is substantially transparent and is merely protective of the LED die. In a second embodiment, the cover 215 includes an optical lens that directs the emitted light. In a third embodiment, the cover 215 is a diffuser to diffuse the emitted light. In a still further embodiment, the substrate 205 is coupled to a conductive plate 210 such as a metal heat sink. The heat sink provides additional cooling for the solid state lamp.

Figure 5:
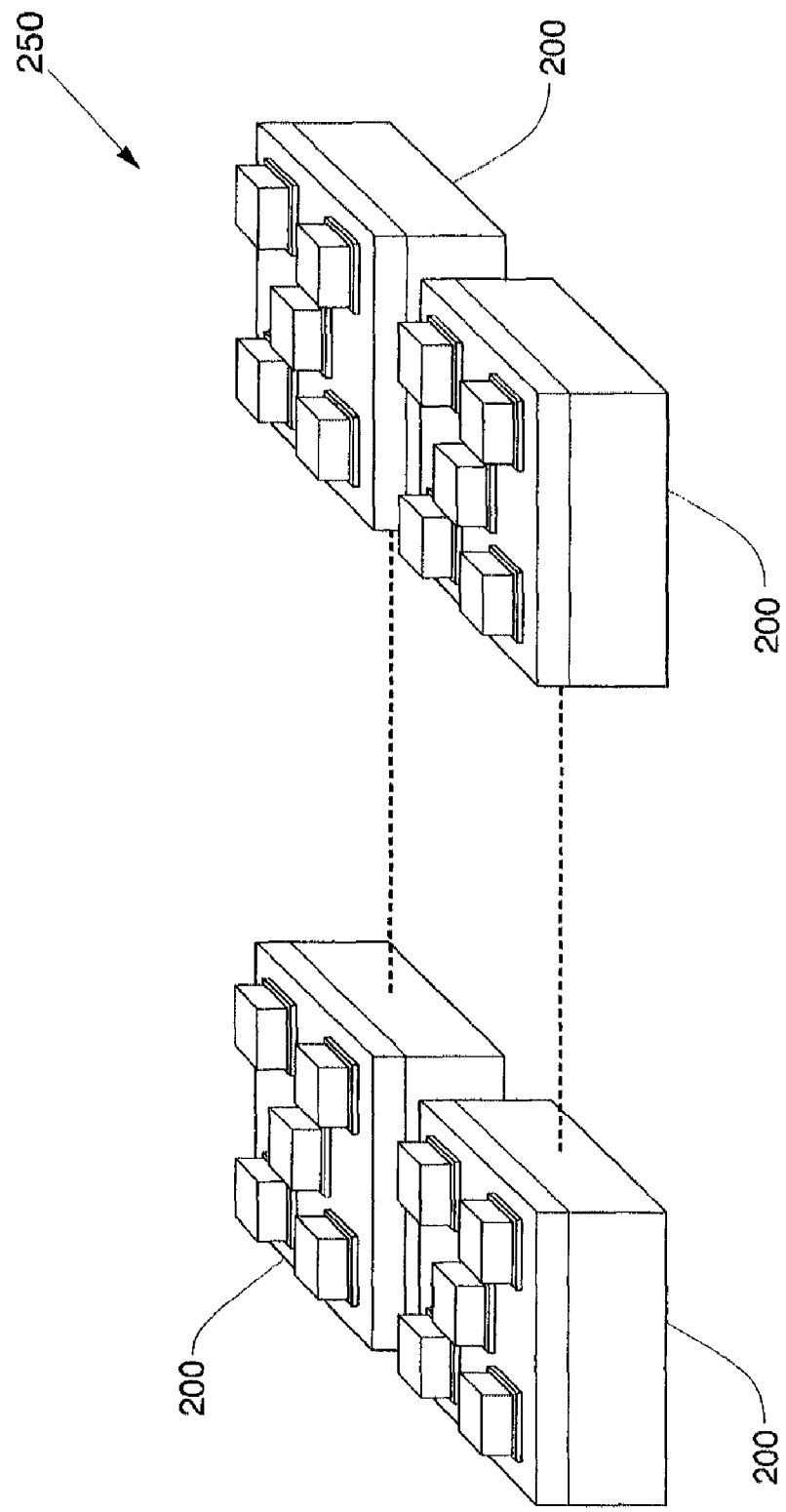
FIG. 5 is a perspective view of a collection of LED modules according to principles of the invention.

FIG. 5 is a perspective view of collection 250 of LED modules 200 according to one embodiment of the invention. As described above, in one embodiment, the LED modules 200 are configured and adapted to a support array forming a solid state lamp. The LED modules 200 are interchangeable and replaceable enabling efficient lamp maintenance. A failed module can easily be replaced. In a second embodiment, the LED modules 200 are configured to connect together to form the solid state lamp.

Figure 6:
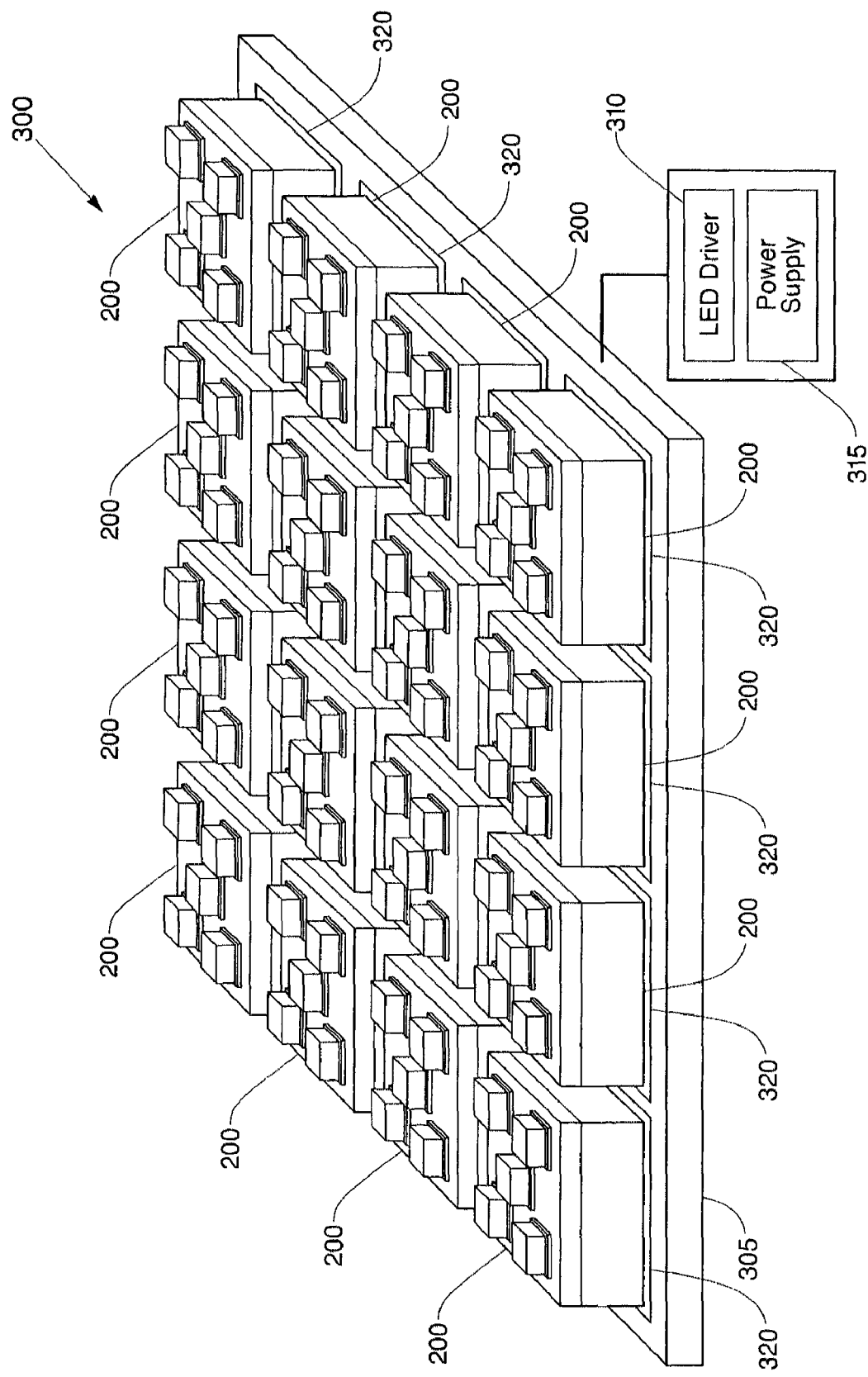
FIG. 6 is a perspective view of an array of LED modules in a high-power LED lamp according to one embodiment of the invention.

FIG. 6 is a perspective view of a high-power LED lamp 300 with the power supply and LED driver in diagram according to one embodiment of the invention. The lamp includes an array of LED modules 200. As described above, each LED module includes a plurality of units. The array of LED modules 200 is supported by a substrate 305. The substrate 305 includes a plurality of locations 320, each location 320 providing physical and electrical interconnect for an LED module 200. This substrate arrangement allows LED modules 200 to be easily removed and replaced. This greatly reduces maintenance expense as only individual modules may be replaced when needed rather than an entire lamp. An LED driver 310 drives the LEDs through connections in the substrate 305. A power supply 315 supplies power for the lamp and, in particular, supplies a constant current to the thermo-electric cooling devices, also through connections in the substrate 305, in the units.

Figure 7:
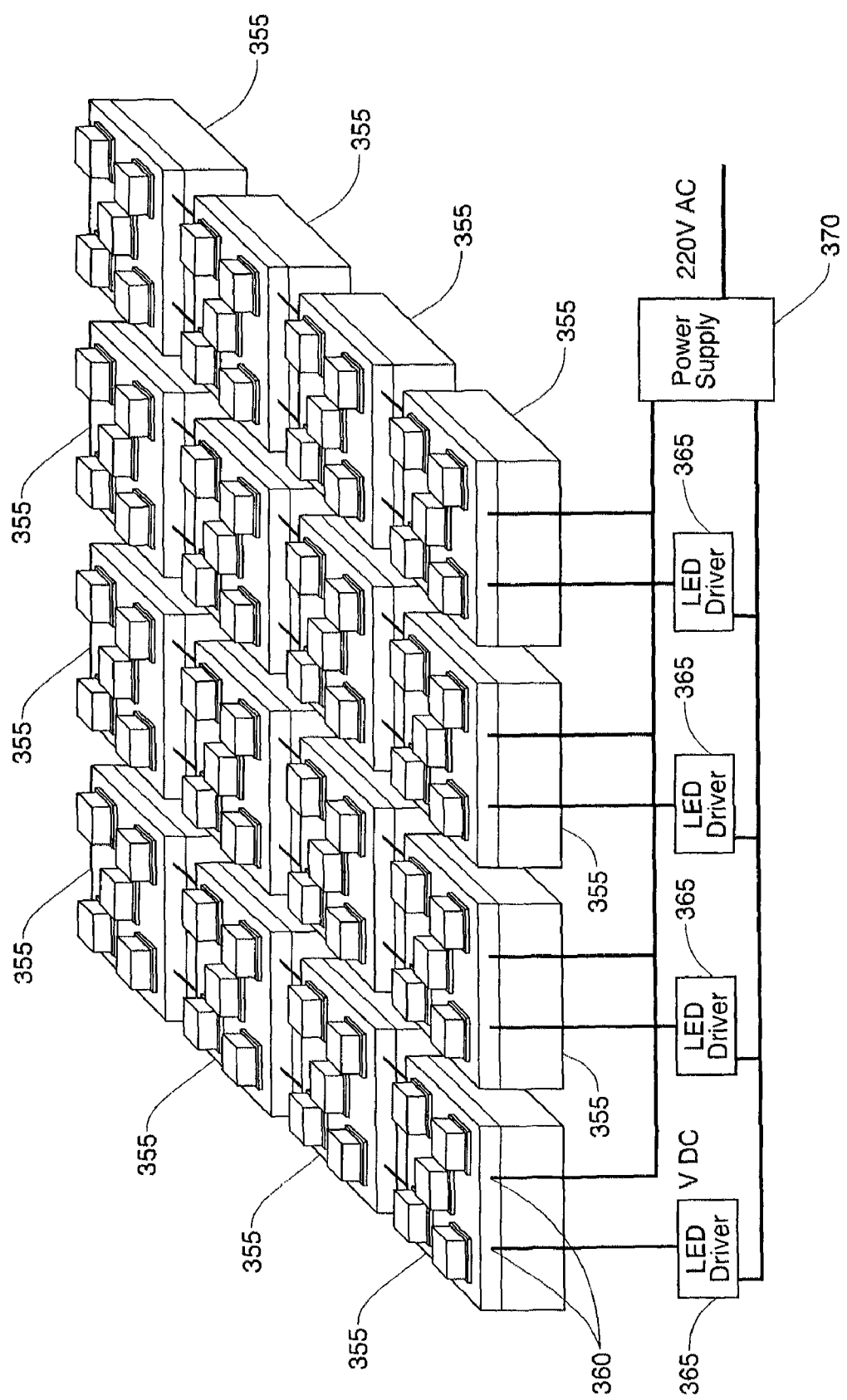
FIG. 7 is a perspective view of an alternative arrangement of an array of LED modules in a high-power LED lamp according to principles of the invention.

FIG. 7 is a perspective view of an alternative embodiment of a high-power LED lamp 350 with the power supply and driver in diagram. The lamp 350 includes an array of LED modules. The LED modules 355 in this arrangement include physical and electrical connections 360 enabling each LED module 355 to mate with any other LED module 355. This arrangement enables the LED modules 355 to be replaceable within the array. In this arrangement, each of a plurality of LED drivers 365 drive one row of LED modules 355 in the array. A power supply 370 supplies power for the lamp and also supplies a constant current to the thermo-electric cooling devices (not shown) in each unit in the LED modules 355.

Figure 8:
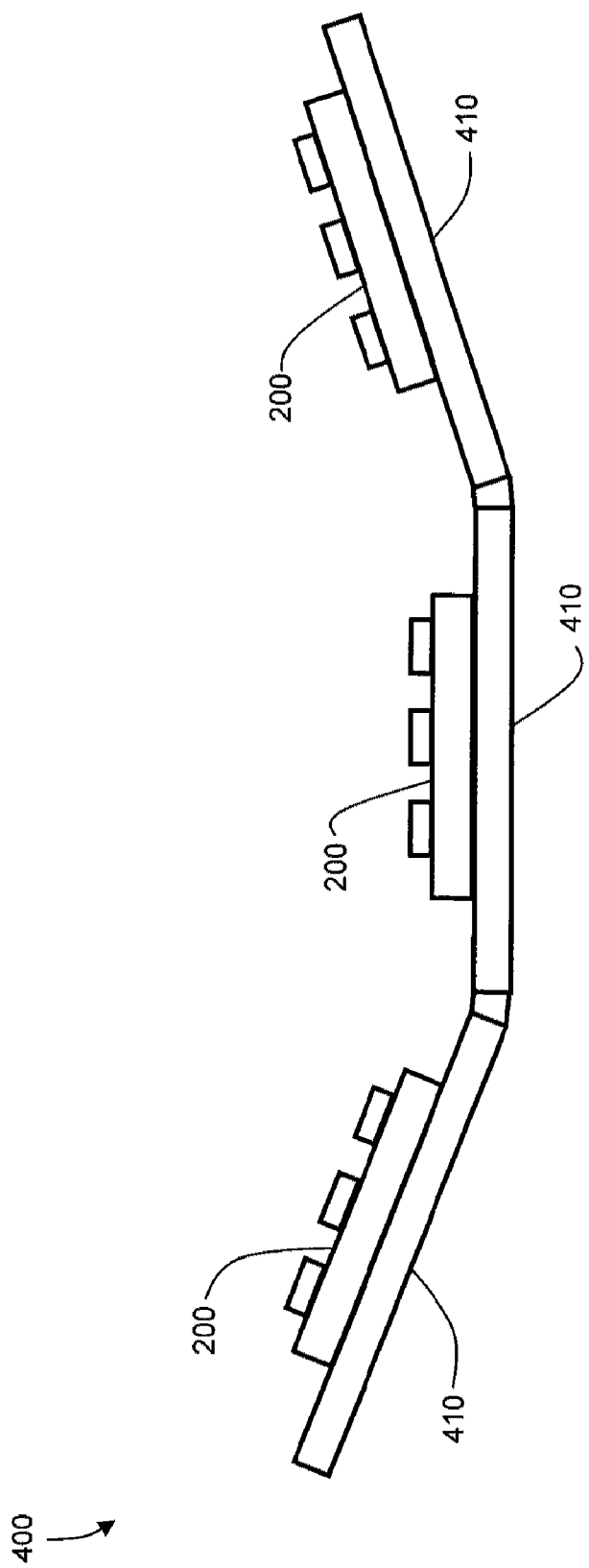
FIG. 8 is a side view of another alternative arrangement of an array of LED modules in a high-power LED lamp according to principles of the invention.

FIG. 8 is a side view of a further alternative embodiment of a high-power LED lamp according to principles of the invention. The LED lamp 400 includes a plurality of LED modules 200. The plurality of LED modules 200 is mounted to substrates 410. The substrates 410 support the LED modules 200 in a non-planar arrangement. Only three LED modules 200 are provided in the illustration for the sake of clarity. The arrangement of substrates 410 and LED modules 200 shown is just one of many possible arrangements and is provided to illustrate that the LED modules may be configured as may be appropriate for a specific application such as area lighting, theatre lighting, parking structure lighting or street lighting. This list is merely exemplary. Other embodiments are possible within the scope of the invention.

In a first arrangement, the LED modules 200 are physically and electrically coupled into the lamp 400 through the substrates 410, the substrates 410 providing conductive connections. In an alternative arrangement, the LED modules 200 are physically coupled to the substrates 410 but electrically coupled though connections between the LED modules 200.

In one embodiment, the LED modules 200 have covers as described above with regard to FIG. 3. In a second embodiment, the lamp 400 includes a cover protecting all the LED modules. In a third embodiment, the lamp 400 includes focusing elements. Further alternative embodiments include diffusion elements.

Figure 9:
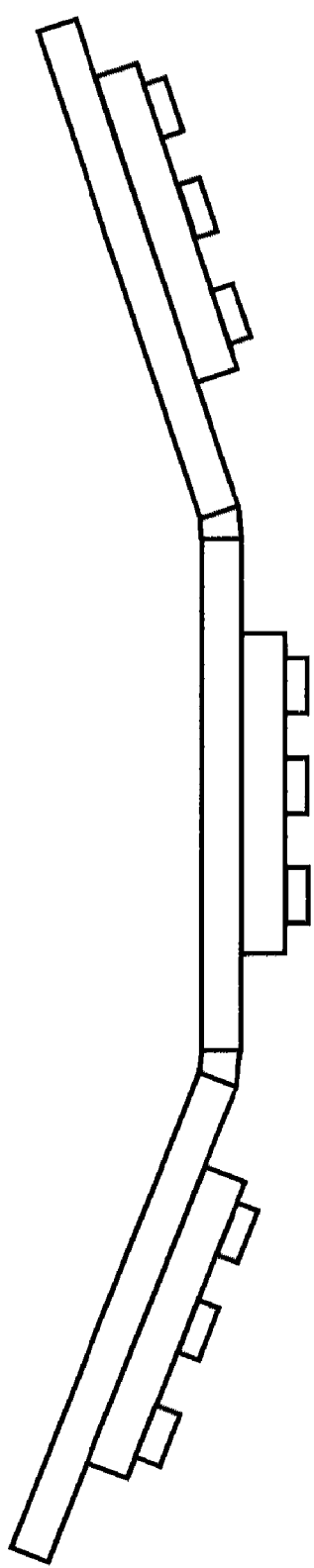
FIG. 9 is a diagram of a still further alternative arrangement of an array of LED modules in a high-power LED lamp according to principles of the invention.

FIG. 9 shows an alternative arrangement of LED modules 420 of a high-power LED lamp to that shown in FIG. 8.

Figure 10:
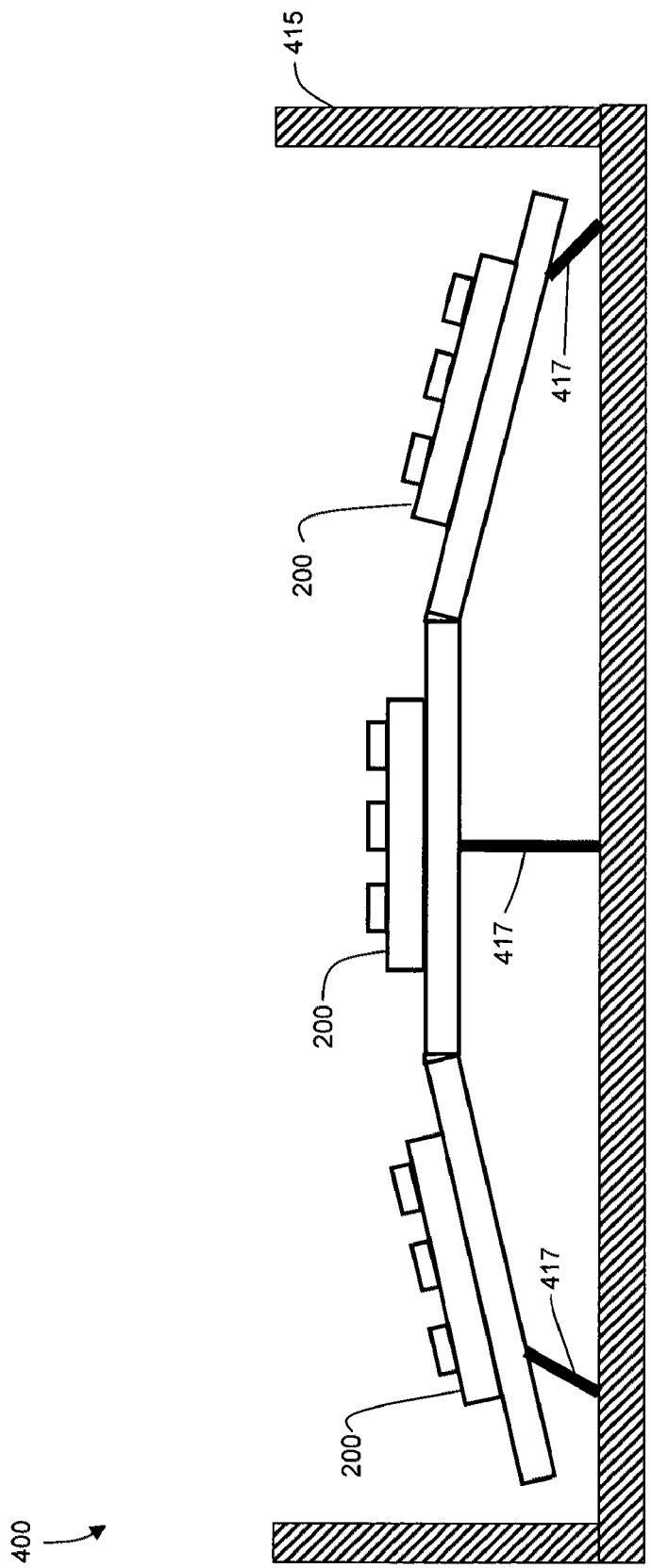
FIG. 10 is a diagram of an alternative embodiment of the high-power LED lamp according to principles of the invention.

FIG. 10 is a further alternative embodiment of a high-power LED lamp 500. In this embodiment, the LED modules 505 are enclosed in a heat conductive housing 415. Each LED module 200 is thermally coupled to the housing 415. In a first arrangement, the thermal coupling of an LED module to the housing is accomplished through a copper ribbon 417. The housing 415 in this embodiment performs as an additional heat sink in addition to those coupled to the LEDs on the LED modules. The heat sinks on the LEDs in this embodiment may therefore be smaller than in other embodiments resulting in an LED lamp that correspondingly weighs less.

Figure 11:
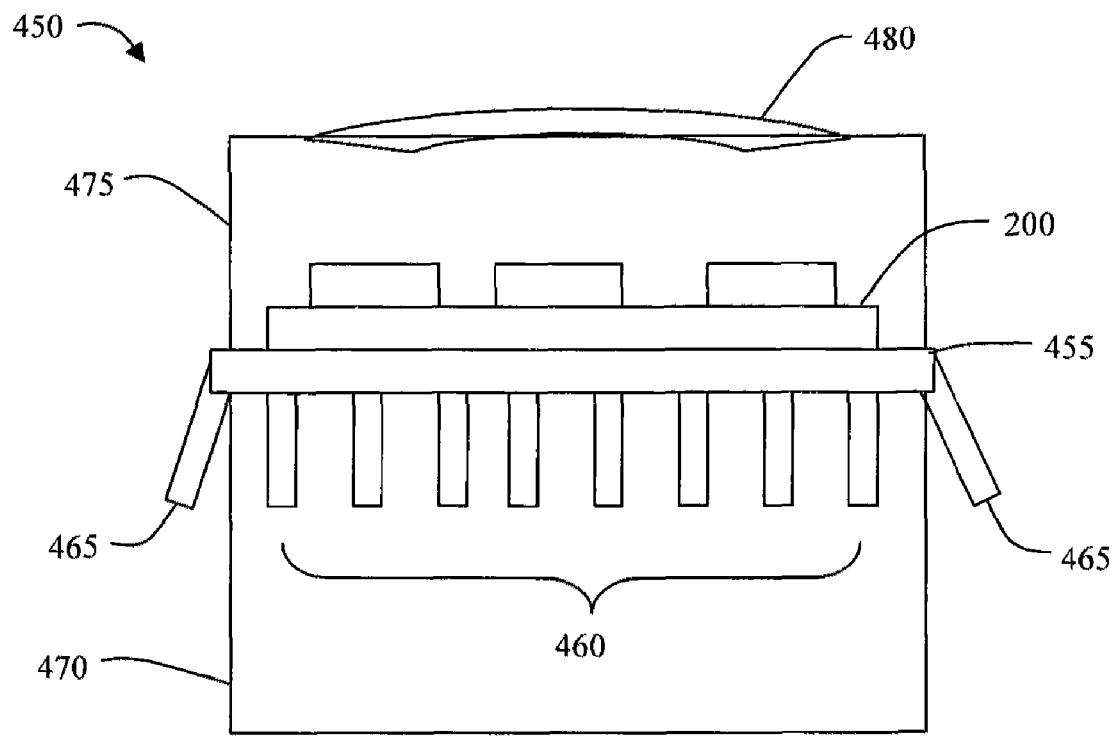
FIG. 11 is a side view of a high-power LED lamp according to another alternative embodiment of the invention.

FIG. 11 is a side view of a high-power LED lamp 450 according to principles of the invention where the high-power LED lamp is suitable for use, for example, as a spot light or a stage light. An LED module 200 as described above is coupled to a heat sink 455 having a plurality of fins 460, 465. A lower housing 470 supports the heat sink 455 and the LED module 200 and contains some of the heat sink fins 460. An upper housing 475 encloses the LED module 200 and supports an optical lens 480 configured to diffuse light from the LED module 200. The heat sink and fins 465 extend outside of the housings 470, 475 for cooling purposes. In the present embodiment, only one LED module 200 is shown for convenience. In a typical application, a plurality of modules would be included in the lamp.

Figure 12:
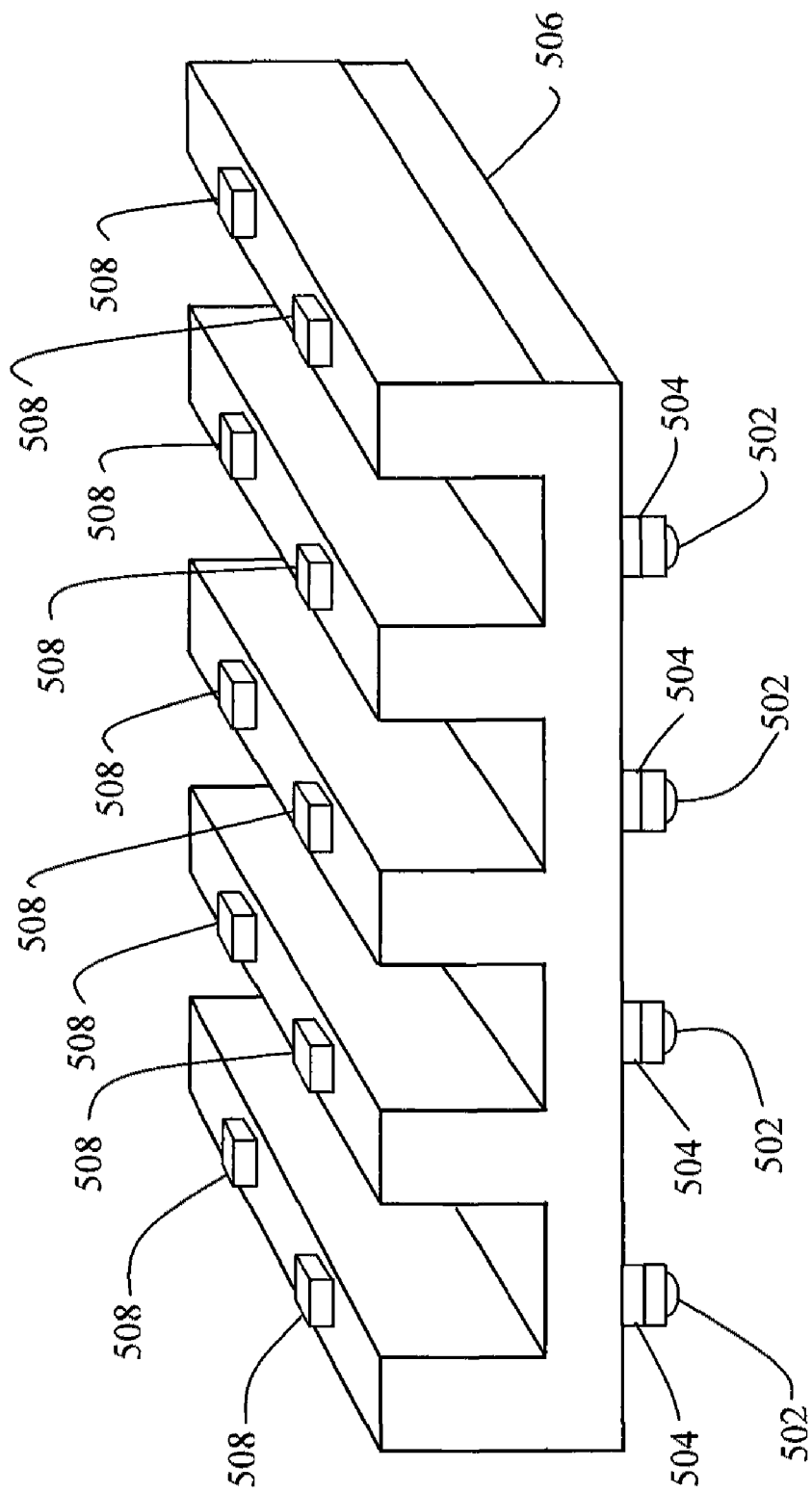
FIG. 12 is a perspective view of an active cooling system for a solid-state lamp according to principles of the invention.

FIG. 12 is a perspective view of an active cooling system for a solid-state lamp according to an embodiment of the invention. The solid-state lamp includes a plurality of LEDs 502. Each LED 502 is in thermal contact with a first side of a thermo cooler 504, also referred to as a Peltier device. A second side of each thermo cooler 504 is in thermal contact with a carbon based material heat sink 506. In a first embodiment, the heat sink is made, for example, of a compressed graphite pad with thickness of 2-3 mm. In a second embodiment, the heat sink is made of a Highly Ordered Pyrolytic Graphite or a highly oriented pyrolytic graphite block with the thickness of 20-50 mm (HOPG) (where the angular spread between each sheet is less than 1 degree) with thermal conductivity if (x, y, z to be at least 400 W/mK). In a third embodiment, the heat sink is made of a nanotube (carbon based) material with very high thermal conductivity along the tube axis Graphite material suitable for use in the present invention is available from T-Global Technology, Ltd. Taipei, Taiwan. A plurality of thermal generators 508 is positioned in thermal contact with the heat sink 506. In the present embodiment, the heat sink 506 has a finned design and the thermal generators 508 are positioned at ends of the fins opposing the location of the thermo coolers and LEDs.

In operation, the LEDs 502 provide light and generate heat. The thermo coolers 504 are powered electrically and draw heat away from the LEDs 502. The heat sink 506 provides further heat spreading and dissipation. Some of the heat flows from the LEDs generating heat across the heat sink 506 and up the fins to the thermo generators 508. The thermo generators 508 generate electrical power from heat from the heat sink 506. This electrical power is provided to the thermo coolers 504 as a portion of the power needed for their operation.

Figure 13:
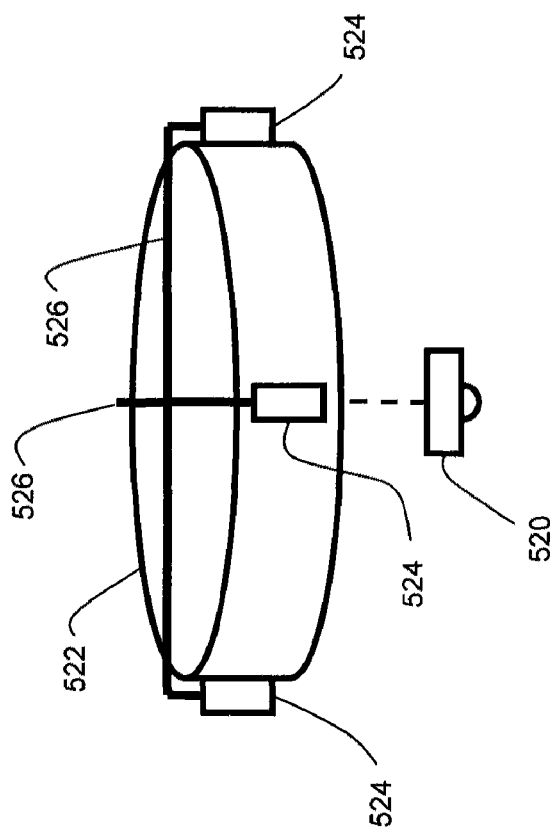
FIG. 13 is a perspective view of an alternative embodiment of an active cooling system for a solid-state lamp according to principles of the invention.

FIG. 13 is a perspective view of an alternative embodiment of an active cooling system for a solid-state lamp. An LED 520 is in thermal contact with a heat sink 522. In an alternative arrangement, an array of LEDs is positioned in thermal contact with the heat sink 522. In this embodiment, the heat sink 522 is made of thermally conductive graphite. Further, the heat sink 522 has a generally cylindrical shape. The cylindrical shape is advantageous as some of the graphite materials have good x, y thermal conductivity (e.g. 200-400 W/mK), but have poor thermal conductivity in the z direction (e.g. 2-5 W/mK). A plurality of thermo generators 524 is located on the curved surface of the heat sink 522. In one arrangement, the thermo generators 524 are spaced substantially equi-distant along the circumference of the heat sink 522. An electrically conductive cable 526 is connected to each thermo generator 524. Each of the cables 526 is of a type and design such that it is also capable of providing physical support for the thermo generator 524.

In operation, the LED 520 generates heat, some of which flows to the heat sink 522. The thermo generators 524, which are in thermal contact with the heat sink 522, generate electrical current from heat received from the heat sink 522. The current flows through the cables or PCB traces and is provided back to LED(s) 520 as a portion of current needed for their normal operation.

Figure 14:
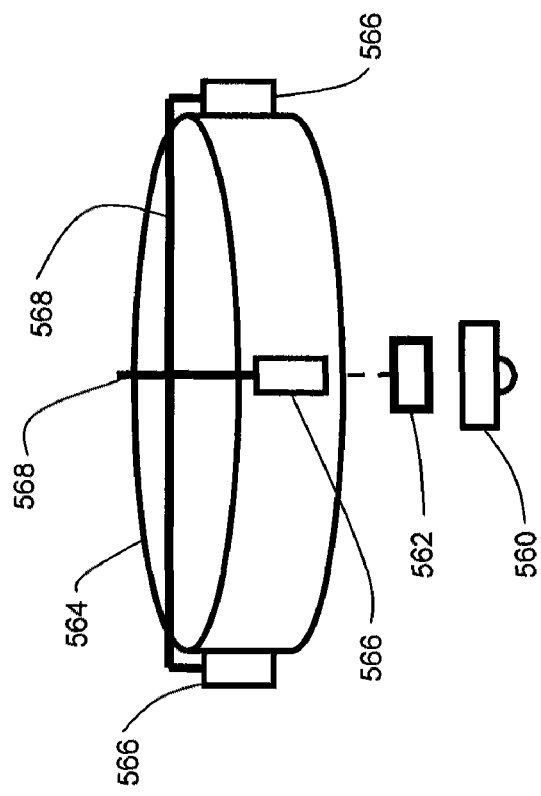
FIG. 14 is a perspective view of an alternative embodiment of an active cooling system according to principles of the invention.

FIG. 14 is a perspective view of an alternative embodiment of an active cooling system for a solid-state lamp. An LED 560 is in thermal contact with an active cooling device 562. The active cooling device 562 is, for example, a nanocooler. In a second arrangement, each of an array of LEDs is in thermal contact with an active cooling device 562. The active cooling device 562 is in thermal contact with a heat sink 564. In this embodiment, the heat sink 564 is made of graphite and has a generally cylindrical shape. The graphite heat sink has, for example, a thermal conductivity of 400 W/mK. A plurality of thermo generators 566 is located on the curved surface of the heat sink 564. In one arrangement, the thermo generators 566 are spaced substantially equi-distantly over the circumference of the heat sink 564. An electrically conductive cable 568 is connected to each thermo generator 566. Each of the cables 568 is of a type and design that is also capable of providing physical support for the thermo generator 566.

In operation, the LED 560 generates heat some of which flows to the active cooler 562. Some of the generated heat flows to the heat sink 564. The thermo generators 566, which are in thermal contact with the heat sink 564, generate electrical current from heat received from the heat sink 564. The current flows through the cables 568 and is provided to the active cooler 562. Since the active cooler 562 pumps heat away from the LED(s) 560, which are sources of heat, and the graphite heat sink is typically more efficient in thermal conductivity than aluminum, and the thermo generators provide some of the power for the active coolers, the cooling system of the present embodiment is typically smaller and lighter in weight than conventional cooling systems. The cooling system is typically more efficient in heat management and accordingly the LEDs can be operated at higher power while maintaining longevity. Further, the cylindrical shape of the heat sink in FIGS. 13 and 14 efficient shapes for dispersing heat from a centrally located heat source, i.e. an LED or an array of LEDs.

Figure 15:
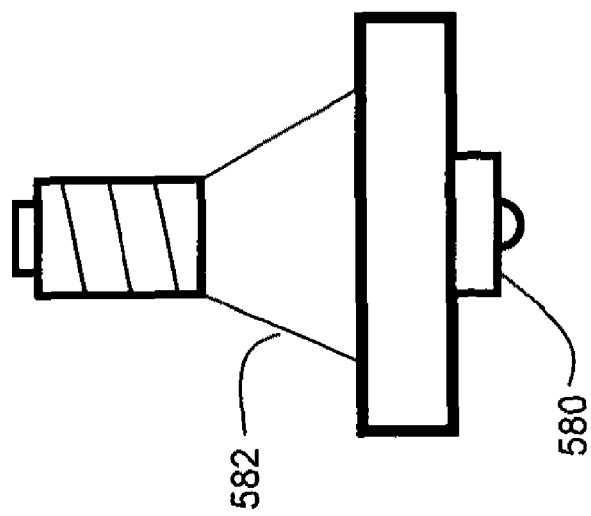
FIG. 15 is a side view of a lamp embodiment capable of using embodiments of the cooling system.

FIG. 15 is a side view of a lamp embodiment capable of using embodiments of the cooling system. The lamp has at least one LED 580. In an alternative arrangement, the lamp has an array of LEDs. The LEDs provide light and also generate heat. The LEDs are contained in a housing 582 that also includes a cooling system such as one of those described above particularly with regard to FIGS. 13 and 14. The cooling system enables the lamp to operate efficiently. The cylindrically-shaped systems complement the shapes of rounded lamps.

Figure 16:
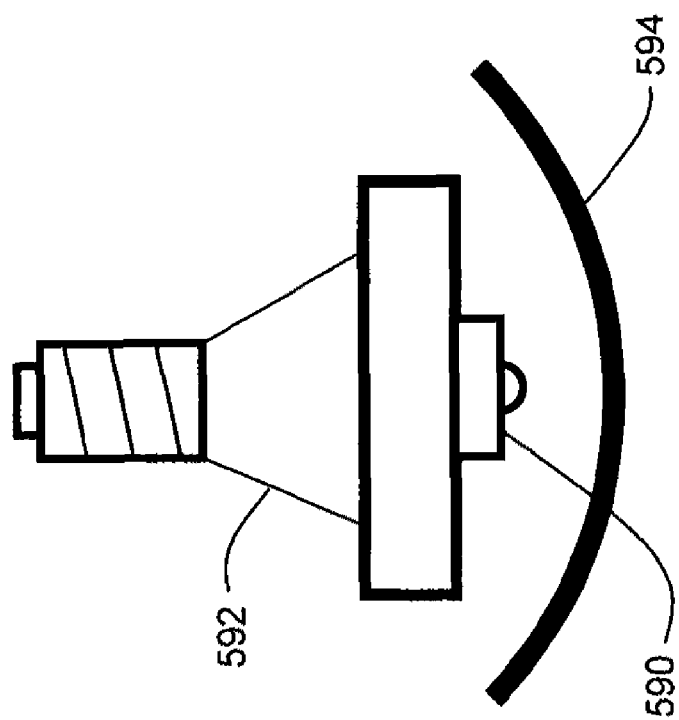
FIG. 16 is a side view of a lamp embodiment according to principles of the invention.

FIG. 16 is a side view of another lamp embodiment according to principles of the invention. The lamp has at least one LED 590. In an alternative arrangement, the lamp has an array of LEDs. The LEDs provide light and also generate heat. The LEDs are contained in a housing 592 that also includes a cooling system such as one of those described above. The cooling system enables the lamp to operate efficiently. A diffuser 594 is located in front of the LEDs configured to diffuse the light from the LEDs.

Figure 17:
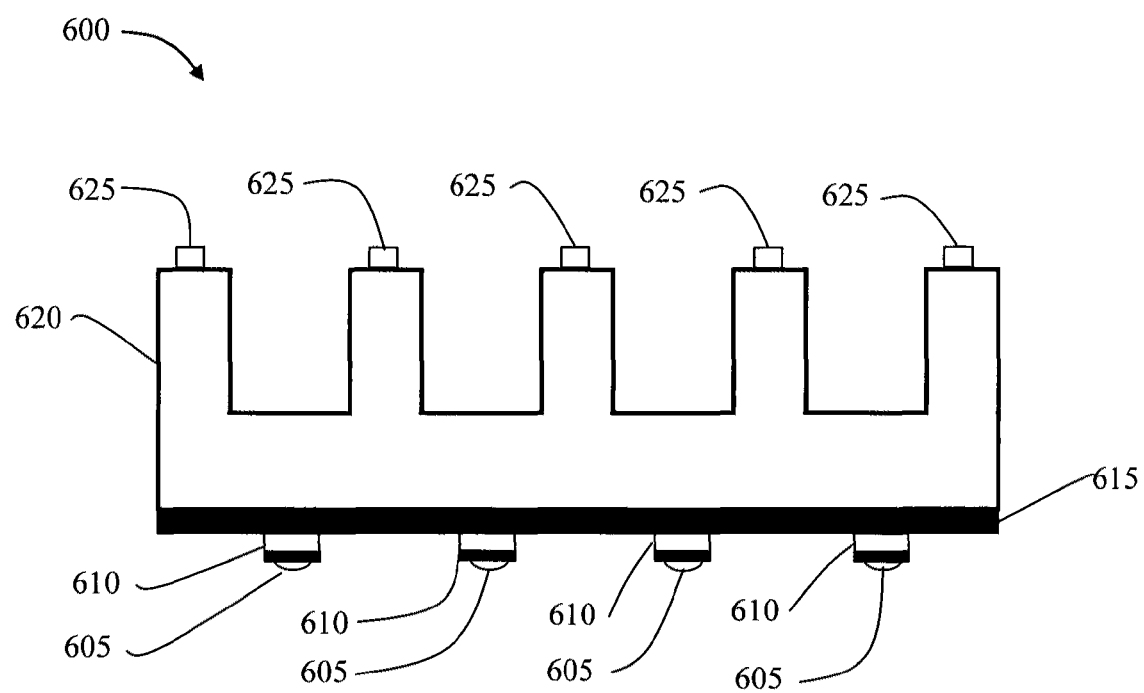
FIG. 17 is a side view of an embodiment of an active cooling system according to principles of the invention.

FIG. 17 is a side view of an alternative embodiment of an active cooling system for a solid-state lamp 600. The solid-state lamp 600 includes a plurality of LEDs 605. Each LED 605 is in thermal contact with a first side of a thermo cooler 610, also referred to as a Peltier device. A second side of each thermo cooler 610 is in thermal contact with a graphite pad 615. The graphite pad typically has thickness in order of 0.1-5 mm. The graphite pad 615 is in thermal contact with a heat sink 620. The heat sink 620 is made of thermally conductive material such as copper or aluminum. In an alternative embodiment, the heat sink is made of a carbon-based material similar to the graphite pad. A plurality of thermal generators 625 is positioned in thermal contact with the heat sink 620. In the present embodiment, the heat sink 620 has a firmed design and the thermal generators 625 are positioned at ends of the fins opposing the location of the thermo coolers 610 and LEDs 605.

Some graphite materials suitable for use in thermal management have good x, y thermal conductivity, but poor z direction thermal conductivity. In the present embodiment, the graphite in the graphite pad 615 is oriented to transfer heat to the heat sink 620. The heat sink 620 is typically selected to have good thermal conductivity in the x, y and z direction. The arrangement in this embodiment is efficient as it removes the heat from the LEDs and distributes the heat in the x and y directions rapidly. The heat sink with fins receives heat from the graphite pad and dissipates the heat to the air.

Figure 18:
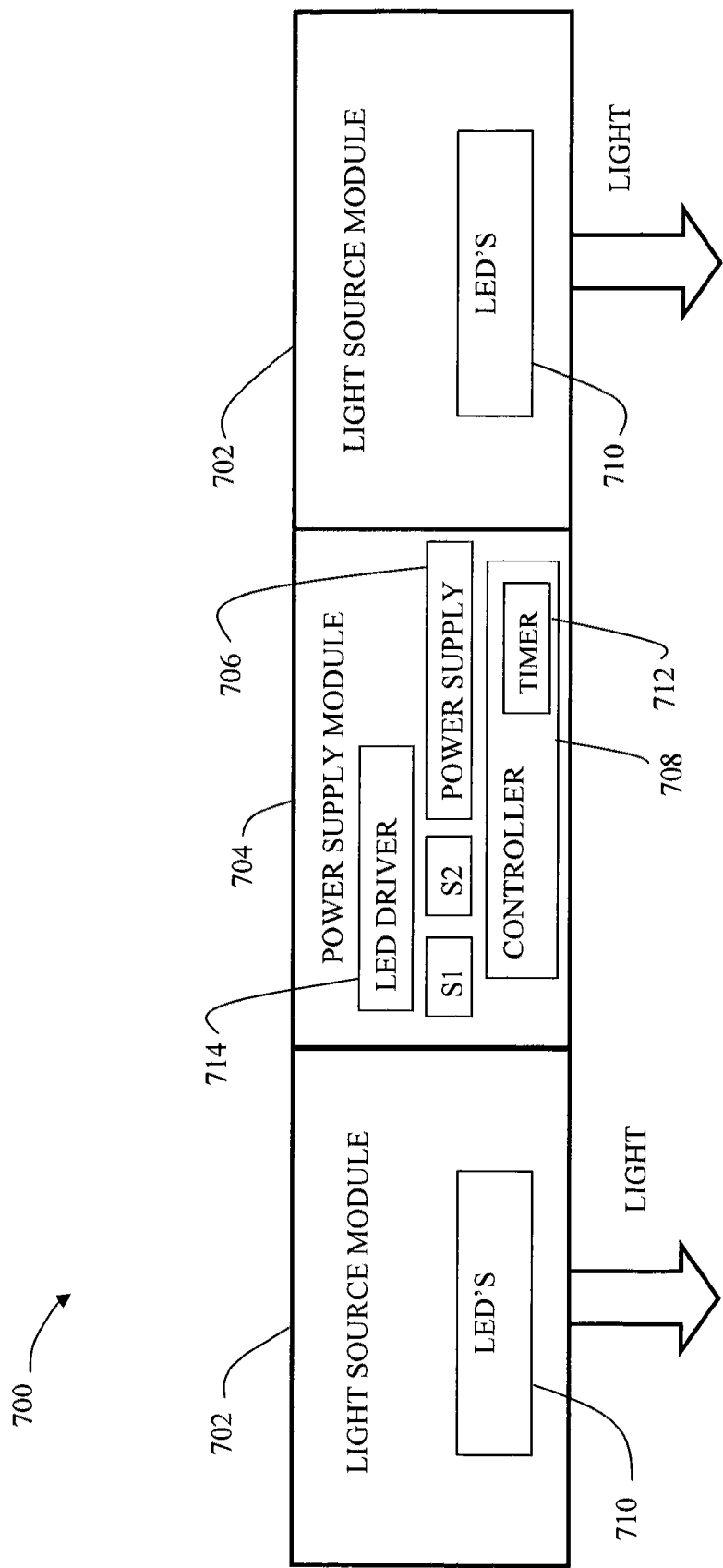
FIG. 18 is a block diagram of a modular solid-state lamp according to principles of the invention.

FIG. 18 is a block diagram of a modular solid-state lamp 700 according to principles of the invention. One example embodiment of the modular solid-state lamp, also referred to as the "fixture" is a low power consumption light emitting diode (LED) fixture. The lamp, in the present embodiment, has three sections or "modules". In the block diagram, there are light source modules 702 on either side of a power supply module 704. The light source modules 702 include a plurality of LEDs 710. The power supply module 704 houses a power supply 706 that powers the light source modules 702 and an LED driver 714 to drive the LEDs in the light source modules 702. The power supply module 704 further includes sensors: a light sensor S1 to sense daylight and a motion sensor S2. The power supply module 704 further includes a controller 708. The controller 708 in one arrangement includes a timer. In another arrangement, the controller includes a dimmer. The sensors S1 and S2 and controller 708 increase the energy efficiency of the fixture 700. In one alternative embodiment, the controller 708 is programmable enabling a user to provide on-off settings and establish thresholds for lamp operation. In operation, the controller 708 responds to sensor data to turn the lamp on or off (or alternatively to dim the lamp) when the sensors do not detect movement in the room or detect that the light level, from windows for example, is sufficient. In those embodiments where a timer is present, the controller operates the lamp according to timed thresholds and periods.

Embodiments of the housing of the power supply module 704 include a mesh screen as one side of the housing (shown in subsequent figures). The screen enables air to flow through the power supply module 704. In one embodiment, the housing has openings on the sides to enable air flow also through the light source modules 702. This air flow cools the power supply 706 and the LEDs in operation. The power supply 706 is preferably sized and configured such that there are spaced between the power supply and all four walls of the power supply module housing so that there is air flow fully around the power supply thereby passively cooling the power supply module 704.

The light source modules 702 are formed and configured such that they can be attached at the ends of the power supply module 704 or at the sides of the power supply module 704. This is described below and illustrated in subsequent figures. Further, the light source modules 702 are configured to be easily removed and replaced thereby making maintenance and serviceability of the lamp 700 easier. In some embodiments, the light source modules 702 are tiltable in order to direct the light generated by the light source modules 702 as desired. In various embodiments of the light source modules 702, thermal management is accomplished using one of the cooling arrangements described above. Some embodiments of the light source modules 702 hold arrays of LED modules as described above. In these embodiments, the LED modules are replaceable generally making these embodiments more cost effective to maintain and repair.

In some embodiments of the fixture, the light source modules and power supply module are of similar size and shape and configured to assemble interchangeable and rearrangably. One advantage of this is aesthetic as the user can create a lamp according to a desired shape. Another advantage is that a lamp fixture can be assembled to direct light where it is needed. The modules are also replaceable which provides the advantage of easy and typically less expensive repair and typically less expensive maintenance compared to conventional lamps. In some embodiments, the modules are of compatible size and shape and retain the advantages of rearrangability and replacability. Finally, separate housing of the light sources and power supply provides an advantage to thermal management. First, the heat generating elements are distributed rather than concentrated in a single housing. Second, the module has only one type of heat generating element and a cooling system most efficient for that element can be used. These advantages will be evident in the descriptions of embodiments below.

Figure 19:
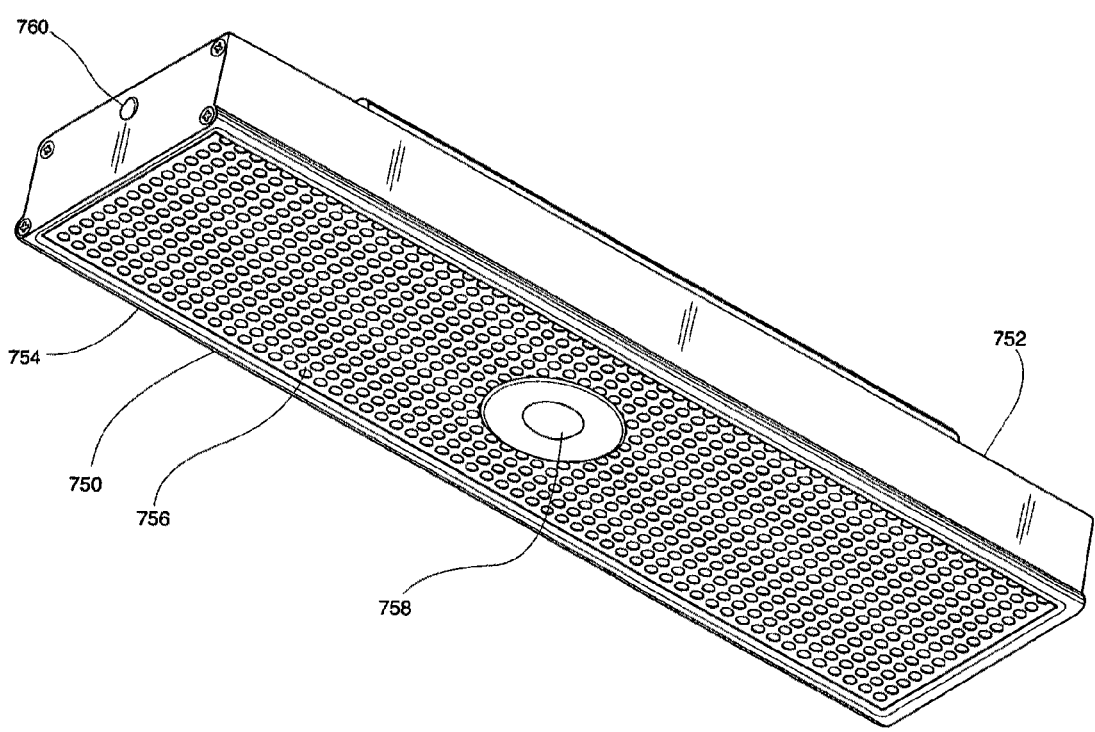
FIG. 19 is a perspective view of a power supply module of a modular lamp according to principles of the invention.

FIG. 19 is a perspective view of a power supply module 750 of a modular lamp according to one embodiment of the invention. The power supply module 750 includes a housing 752 having a top (not shown), a bottom 754 and four sides. In the present embodiment, electrical connection points 760, also referred to as mating elements, are located at either end of the housing 752. Connectors on light source modules in one embodiment are configured to mate with the power supply module 750 at the connection points 760 thereby establishing the electrical connection to power the light source modules. Alternatively, cable connections can be used to establish the electrical connection between modules. In an alternative embodiment, the mating elements 760 may also be used for mechanical connection between the power supply module and light source modules.

The top and bottom 754 of the power supply module 750 have openings that enable air to flow into and out of the module 750 for passive cooling of the power supply module 750. In the present embodiment, the bottom 754 of the module 750 is a screen 756 that enables air to flow into the module 750. The module 750 further includes sensors 758 as described above with regard to FIG. 18. The air flow contributes to cooling the power supply module 750 while the sensors 756 contribute to its energy efficiency by controlling lamp operation in response to sensor data. Further, the separation of the power supply in a separate module away from the LEDs in the light source modules distributes heat generating elements in the modular lamp thereby improving overall thermal management.

Figure 20:
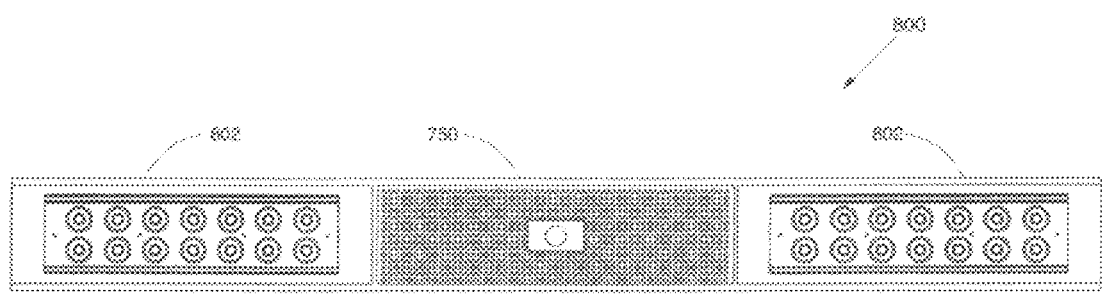
FIG. 20 is a bottom view of an embodiment of a modular solid-state lamp according to principles of the invention.

FIG. 20 is a bottom view of the modular solid-state lamp 800. The solid state lamp 800 of the present embodiment has three modules: a power supply module 750 and light source modules 802 connected to either end. The power supply module 750 is that as described above with regard to FIG. 19. The light source modules 802 each include a plurality of LEDs and thermal management elements as described in various embodiments herein.

The modules 750, 802 are elongated, narrow in one dimension and relatively long in another. The modules 750, 802 in the present lamp 800 are connected at narrow ends thereby forming an elongated lamp structure. The modules 750, 802 in a first arrangement are connected by means of brackets. Other connection means in other arrangements include screws, brackets, brackets with screws, mating slots, clamps, and plugs and receiving elements. One skilled in the art will recognize that the present invention is not limited to the mechanical connection methods listed here. In an alternative embodiment, the electronic connection between modules is combined with the mechanical connection.

Each of the modules 750, 802 is replaceable. Accordingly if one of the light source modules 802 or the power supply module 750 fails, the lamp 800 is easily repaired by replacing the failed module. Further, separation of heat generating elements in the modular lamp 800 into different modules, that is, locating LEDs in one module and the power supply in another module, improves thermal management. One reason that this arrangement is advantageous to cooling is that this arrangement prevents the additive heating that would occur if the LEDs and the power supply were in the same housing.

Figure 21A:
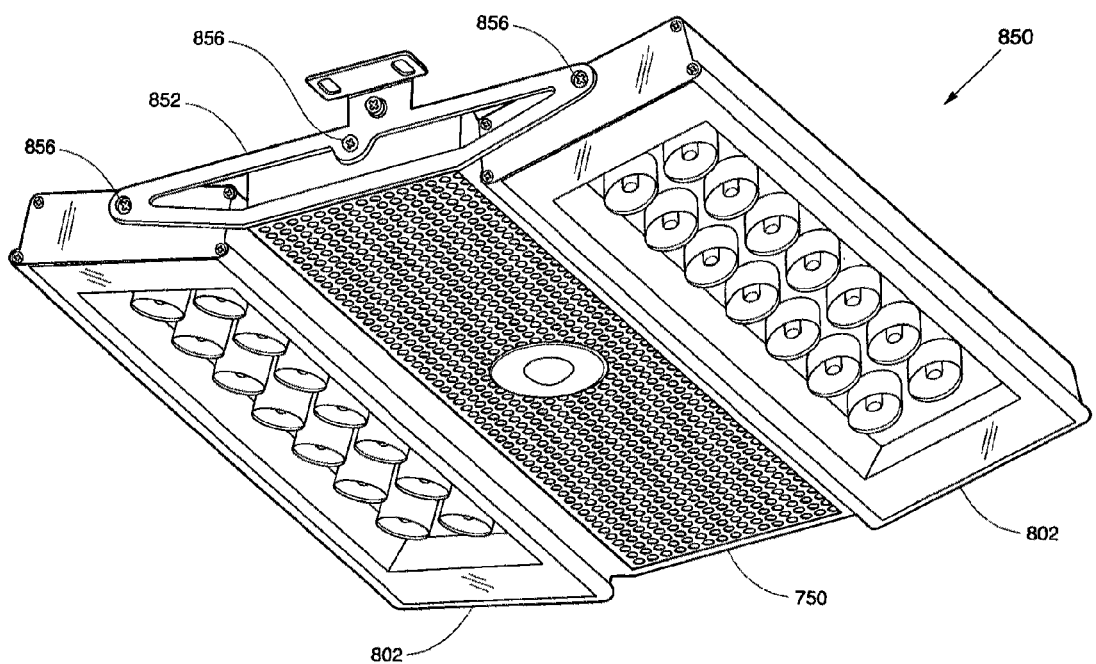
FIG. 21A is a bottom perspective view of an alternative embodiment of a solid-state lamp according to principles of the invention.

FIG. 21A is a bottom perspective view of a modular lamp 850 having an alternative arrangement to that shown above in FIG. 20. In this embodiment, the light source modules 802 are connected along the longer sides of the power supply module 750. The light source modules 802 in this embodiment are tiltable in order to direct light where desired. Each of the modules 750, 802 has at least one attachment point 856. Attachment points 856 on the modules 750, 802 align so that assembly can be accomplished. In this embodiment, the modules 750, 802 are connected together by means of brackets 852 which are attached using attachment points 856 on each of the modules 750, 802.

Figure 21B:
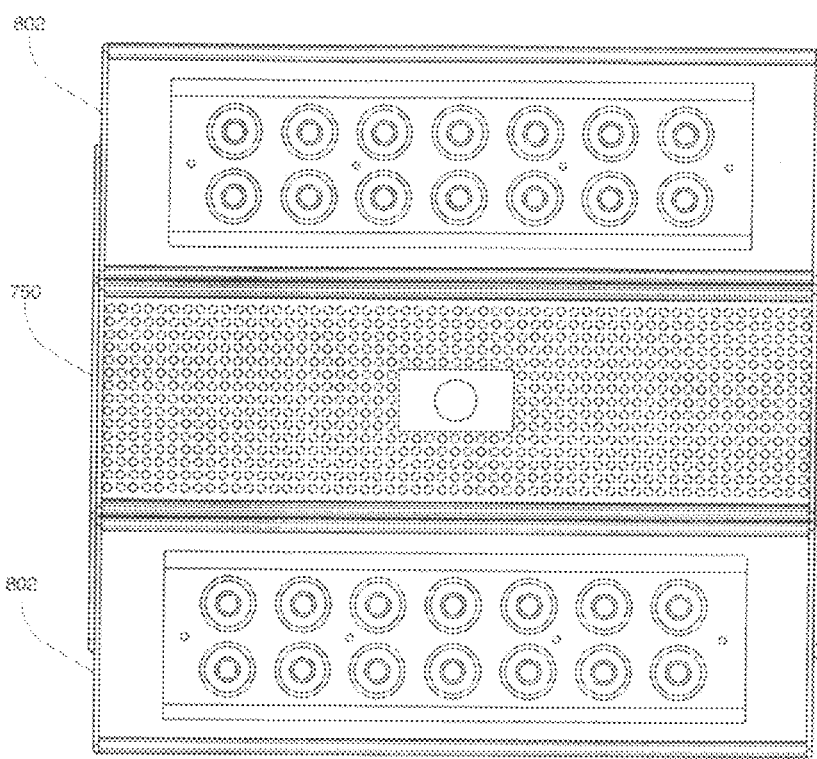
FIG. 21B is a bottom view of the second alternative embodiment of the solid-state lamp of FIG. 21A.
Figure 21C:
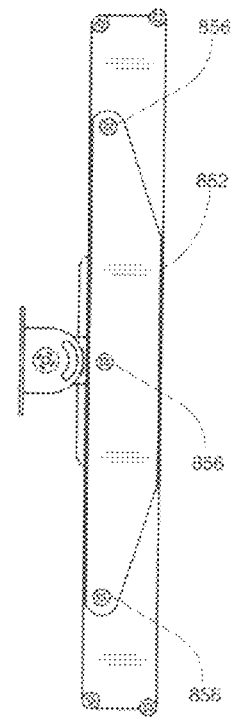
FIG. 21C is a right side view of the second alternative embodiment of the solid-state lamp of FIG. 21A.
Figures 21D, 21E:
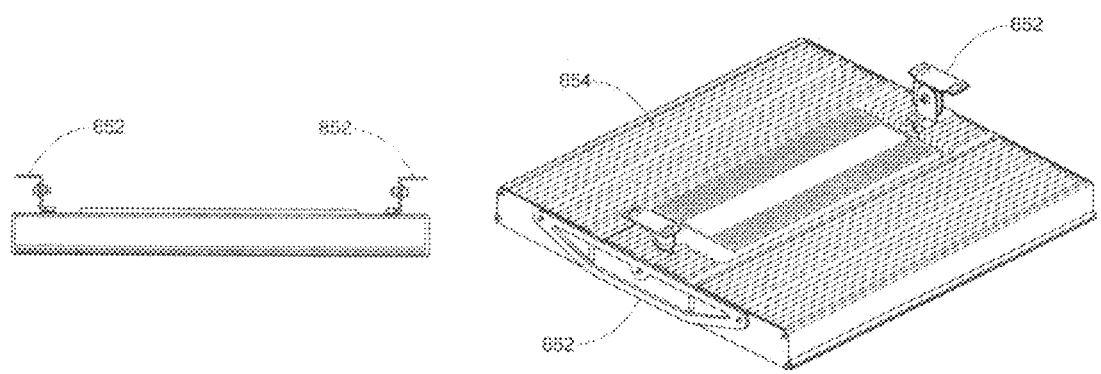
FIG. 21D is a front view of the second alternative embodiment of the solid-state lamp of FIG. 21A.
FIG. 21E is a top perspective view of the second alternative embodiment of the solid-state lamp of FIG. 21A.

FIG. 21B is a bottom view of the modular lamp 850. FIG. 21C is a side view, FIG. 21D is a front view, and FIG. 21E is a top perspective view. In these views, the modules are shown in an untilted position. In this embodiment, the tops of the housings of each of the modules 750, 802 includes a grill 854 providing openings for air flow through the modules 750, 802. One skilled in the art will recognize that present invention is not limited to the screen and the grill for providing openings for air flow through the modules.

FIG. 22A is a front view of a heat sink 900; FIG. 22B is a right side view of the heat sink 900; and FIG. 22C is a top view of the heat sink 900. In some embodiments described above, the thermal management portion of a module includes a heat sink. Heat sinks of conventional design may be used as part of the cooling of the modular lamp as described above, however, a heat sink 900 as shown in FIG. 22A, B and C may alternatively be used. The heat sink 900 has a base 902 that supports a single fin 904. Typically, a heat sink in a lamp would have a plurality of fins however, a single fin is shown here for the sake of clarity and convenience. The fin 904 includes a plurality of protrusions 906, or sub-fins that increase the overall surface area of the heat sink 900 without substantially increasing the space that the heat sink 900 occupies. The increased surface area enhances the heat sinks ability to transfer heat from itself to the surrounding environment.

FIG. 23A is a front view of an alternative embodiment of a heat sink 910; FIG. 23B is a right side view of the heat sink 910; and FIG. 23C is a top view of the heat sink 910. The heat sink 910 has a base 912 that supports fins 914, 915, and 916. Each fin 914, 915 and 916 includes a plurality of protrusions 918 that increase the overall surface are of the heat sink 910.

Figure 24:
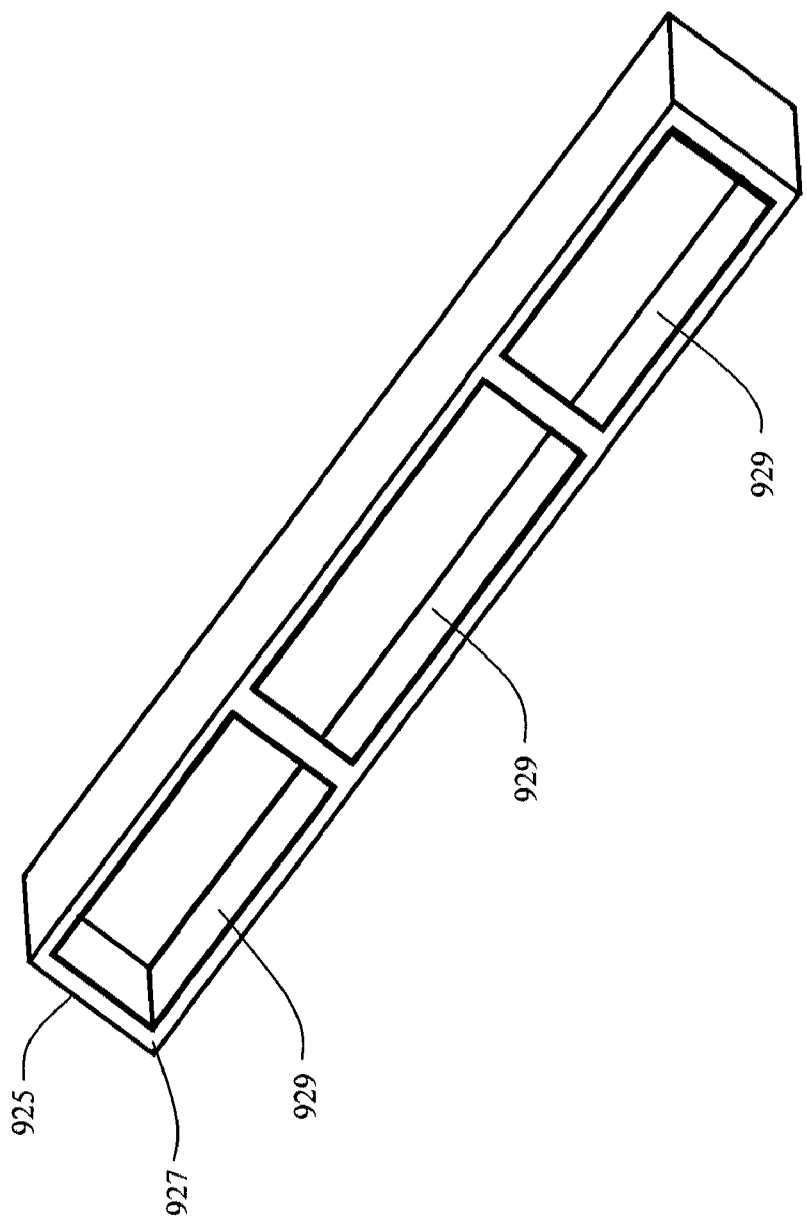
FIG. 24 is a perspective view of a frame to hold modules in a lamp according to one embodiment of the invention.

FIG. 24 is a bottom perspective view of a frame. The frame 925 is an alternative means for constructing a modular lamp according to one embodiment of the invention. The frame 925 is elongated similarly to the embodiment described above with regard to FIG. 20. One skilled in the art will understand that other frame configurations are possible within the scope of the invention. The frame in the present embodiment 925 is configured to hold two light source modules and a power supply module (not shown). The bottom 927 of the frame 925 has three openings 929 that are smaller than the modules such that the modules are supported by the bottom 927 of the frame 929. In various arrangements, the modules are held in the frame with connectors such as screws or clamps. The electronic connections between modules are for example cable connections however one skilled in the art will understand that other types of electronic connections are possible within the scope of the invention. Modules are easily placed and removed from the frame which provides the advantage that the lamp is easily maintained and repaired. Further the present embodiment enables decorative alternatives to be available in the form of various frames while using standardized light source and power supply modules.

Figure 25:
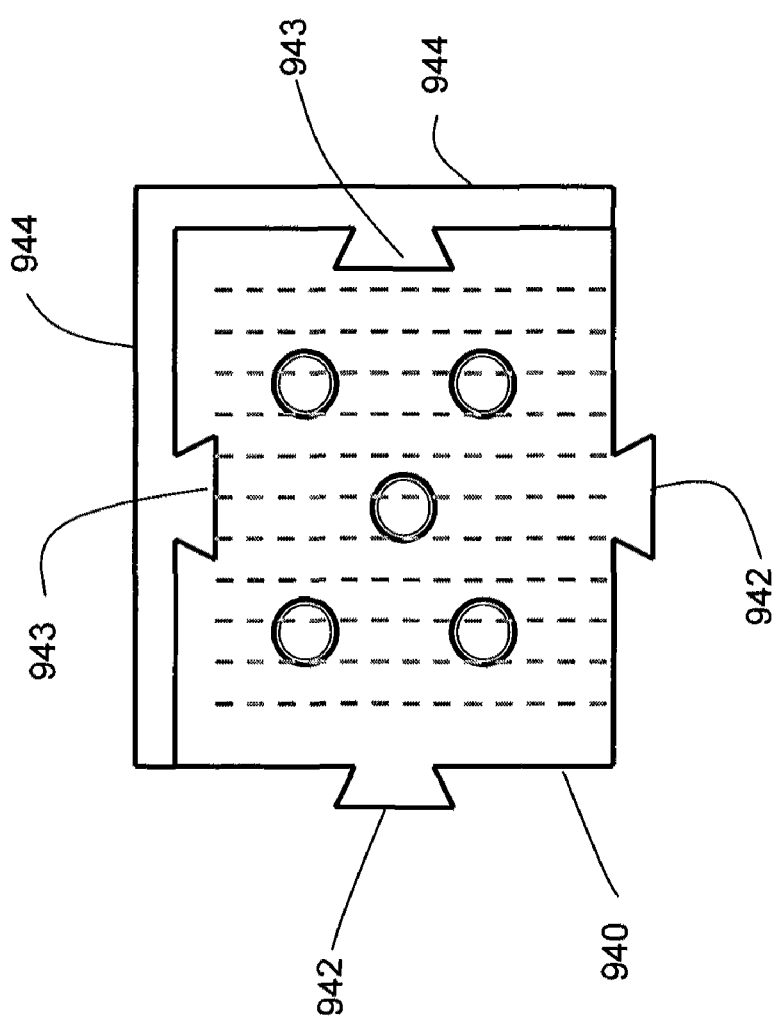
FIG. 25 is a top view of an LED module having an alternative configuration for lamp assembly.

FIG. 25 is a top view of an LED module having an alternative configuration for lamp assembly. The LED module 940 is generally rectangular. A dovetail 942 extends from each of two of the sides of the LED module 940. Each of the remaining sides of the LED module 940 has an opening 943 shaped and configured to receive dovetails. Each of the sides having an opening includes an extension 944 under the opening and extending away from the side of LED module 940. The LED module 940 is assembled into a lamp by using the dovetails 942 and openings 943 to connect them together similar to puzzle pieces The extensions 944 support the connected modules. Shapes other than the dovetail are possible within the scope of the invention.

Solid state lamps according to embodiments of the invention are energy efficient both through the use of low-energy consumption light sources but also through the passive cooling of the design as well as through the sensors and controller that govern operation of the lamp such that light is provided when needed. The fixtures may be turned off or dimmed when light is not needed.

It is to be understood that the above-identified embodiments are simply illustrative by those skilled in the art which will embody the principles of the invention and fall within the spirit and scope thereof.

I claim:
1. A cooling system for a solid-state lamp, comprising:
a thermo-electric cooling device for coupling to a LED die;
a heat sink is in thermal connection with the thermo-electric cooling device, wherein the heat sink is substantially cylindrical, wherein the heat sink is made of compressed graphite having better thermal conductivity in two dimensions than in a third dimension, and further wherein the compressed graphite is arranged in the heat sink such that the better thermal conductivity is radial; and
a plurality of thermal generators is in thermal connection with the heat sink, the plurality of thermal generators are arranged substantially equi-distantly along a circumference of the heat sink, the thermal generators generating current from transferred heat, the current provided to the thermo-electric cooling device.

2. The cooling system of claim 1 further comprising a graphite pad interposed between the thermo-electric cooling device and the heat sink.

3. The cooling system of claim 1 wherein the heat sink includes a plurality of fins and each fin includes a plurality of protrusions.

4. The cooling system of claim 1 further comprising a plurality of electrical cables, wherein each of the plurality of thermal generators is coupled to an electrical cable, wherein the electrical cables provide mechanical support for the plurality of thermal generators.

5. An active cooling system for a lamp having at least one LED, comprising:
a substantially cylindrical heat sink having a circumferential surface, wherein the heat sink is made of compressed graphite having better thermal conductivity in two dimensions than in a third dimension, and further wherein the compressed graphite is arranged in the heat sink such that the better conductivity is radial;
a plurality of cables capable of carrying an electric current; and
a plurality of thermo generators are arranged substantially equi-distantly along the circumference surface of the heat sink, each of the plurality of thermo generators connected to one of the plurality of cables, wherein the thermo generators generate electrical energy from heat and the electrical energy is provided to the at least one LED by the cables.

6. The active cooling system of claim 5 further comprising a thermal electric cooling device is in thermal contact with the heat sink and the at least one LED, the thermal electric cooling device receives some electrical current for operation from at least one of the plurality of thermo generators.

* * * * *